(12) United States Patent
Facchetti

(10) Patent No.: US 8,664,339 B2
(45) Date of Patent: Mar. 4, 2014

(54) ORGANIC SEMICONDUCTING POLYMERS

(75) Inventor: Antonio Facchetti, Chicago, IL (US)

(73) Assignees: Polyera Corporation, Skokie, IL (US); BASF SE, Ludwigshafen (DE)

( * ) Notice: Subject to any disclaimer, the term of this patent is extended or adjusted under 35 U.S.C. 154(b) by 127 days.

(21) Appl. No.: 13/128,214

(22) PCT Filed: Nov. 6, 2009

(86) PCT No.: PCT/EP2009/064722
§ 371 (c)(1),
(2), (4) Date: May 6, 2011

(87) PCT Pub. No.: WO2010/052287
PCT Pub. Date: May 14, 2010

(65) Prior Publication Data
US 2011/0213117 A1    Sep. 1, 2011

Related U.S. Application Data

(60) Provisional application No. 61/112,492, filed on Nov. 7, 2008.

(51) Int. Cl.
| | | |
|---|---|---|
| C08G 73/10 | (2006.01) | |
| C08F 265/10 | (2006.01) | |
| C08F 267/10 | (2006.01) | |
| C08G 73/00 | (2006.01) | |
| C08F 265/00 | (2006.01) | |
| C08F 267/00 | (2006.01) | |

(52) U.S. Cl.
USPC ........... 525/282; 525/279; 525/242; 528/322; 528/310; 257/40

(58) Field of Classification Search
USPC ................. 525/282, 279, 242; 528/322, 310; 257/40
See application file for complete search history.

(56) References Cited

U.S. PATENT DOCUMENTS

| | | |
|---|---|---|
| 2010/0283047 A1 | 11/2010 | Facchetti et al. |
| 2011/0120558 A1 | 5/2011 | Facchetti et al. |

FOREIGN PATENT DOCUMENTS

EP    0 769 532    3/2002

OTHER PUBLICATIONS

He et al., "A New Copolymer Containing Perylene Bisimide and Porphyrin Moieties: Synthesis and Characterization, " *Macromol. Chem. Phys.*, 206:2199-2205 (2005).
He et al., "Synthesis and Characterization of New Types of Perylene Bismide-Containing Conjugated Copolymers," *Macromol. Rapid Commun.*, 26:721-727 (2005).
International Preliminary Report on Patentability for PCT/EP2009/064722, May 10, 2011.

*Primary Examiner* — Duc Truong
(74) *Attorney, Agent, or Firm* — Karen K. Chan

(57) ABSTRACT

Disclosed are new organic semiconducting polymers. The polymers disclosed herein can exhibit high carrier mobility and/or efficient light absorption/emission characteristics, and can possess certain processing advantages such as solution-processability and/or good stability at ambient conditions.

20 Claims, 2 Drawing Sheets

ORGANIC SEMICONDUCTING POLYMERS

CROSS-REFERENCE TO RELATED APPLICATIONS

This application is the national phase of International (PCT) Patent Application Serial No. PCT/EP2009/064722, filed on Nov. 6, 2009, which claims priority to and the benefit of U.S.S.N. 61/112,492 filed on Nov. 7, 2008, the disclosures of which are incorporated herein by reference.

BACKGROUND

A new generation of optoelectronic devices such as organic thin film transistors (OTFTs), organic light emitting transistors (OLETs), organic light emitting diodes (OLEDs), printable circuits, organic photovoltaic (OPV) devices, electrochemical capacitors, and sensors are built upon organic semiconductors as their active components. To enable high device efficiencies such as large charge carrier mobilities ($\mu$) needed for transistor/circuit operations, or efficient exciton formation/splitting necessary for OLED/OPV operations, it is desirable that both p-type and n-type organic semiconductor materials are available. Furthermore, these organic semiconductor-based devices should exhibit satisfactory stability in ambient conditions and should be processable in a cost-effective manner.

Several p- and n-channel molecular semiconductors have achieved acceptable device performance and stability. For example, OTFTs based on acenes and oligothiophenes (p-channel) and perylenes (n-channel) exhibit carrier mobilities ($\mu$'s) >0.5 cm$^2$/Vs in ambient conditions. However, molecular semiconductors typically are less easily processable via printing methodologies than polymeric semiconductors due to solution viscosity requirements.

Accordingly, the art desires new polymeric semiconductors, particularly those having good stability, processing properties, and/or charge transport characteristics in ambient conditions.

SUMMARY

In light of the foregoing, the present teachings provide organic semiconducting polymers that can address various deficiencies and shortcomings of the prior art, including those outlined above. Also provided are associated devices and related methods for the preparation and use of these polymers. The present polymers can exhibit properties such as excellent charge transport characteristics in ambient conditions, chemical stability, low-temperature processability, satisfactory solubility in common solvents, and processing versatility (e.g., printability). As a result, field effect devices such as thin film transistors that incorporate one or more of the present polymers as the semiconductor layer can exhibit high performance in ambient conditions, for example, demonstrating one or more of large electron mobilities, low threshold voltages, and high current on-off ratios. Similarly, other organic semiconductor-based devices such as OPVs, OLETs, and OLEDs can be fabricated efficiently using the polymeric materials described herein.

Generally, the present teachings provide polymers that can be represented by the formula:

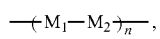

wherein $M_1$ has the formula:

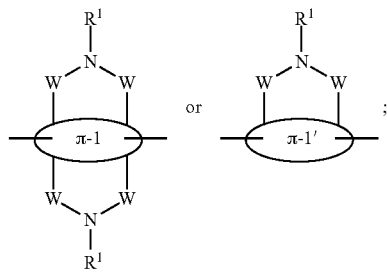

$M_2$ has a formula selected from:

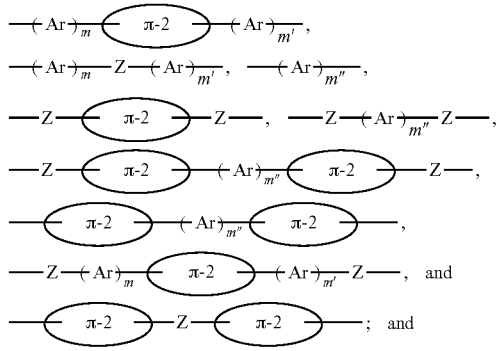

n is an integer greater than 2;
wherein $\pi$-1, $\pi$-1', $\pi$-2, Ar, $R^1$, W, Z, m, m', and m" are as defined herein.

The present teachings also provide methods of preparing such polymers and semiconductor materials, as well as various compositions, composites, and devices that incorporate the polymers and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
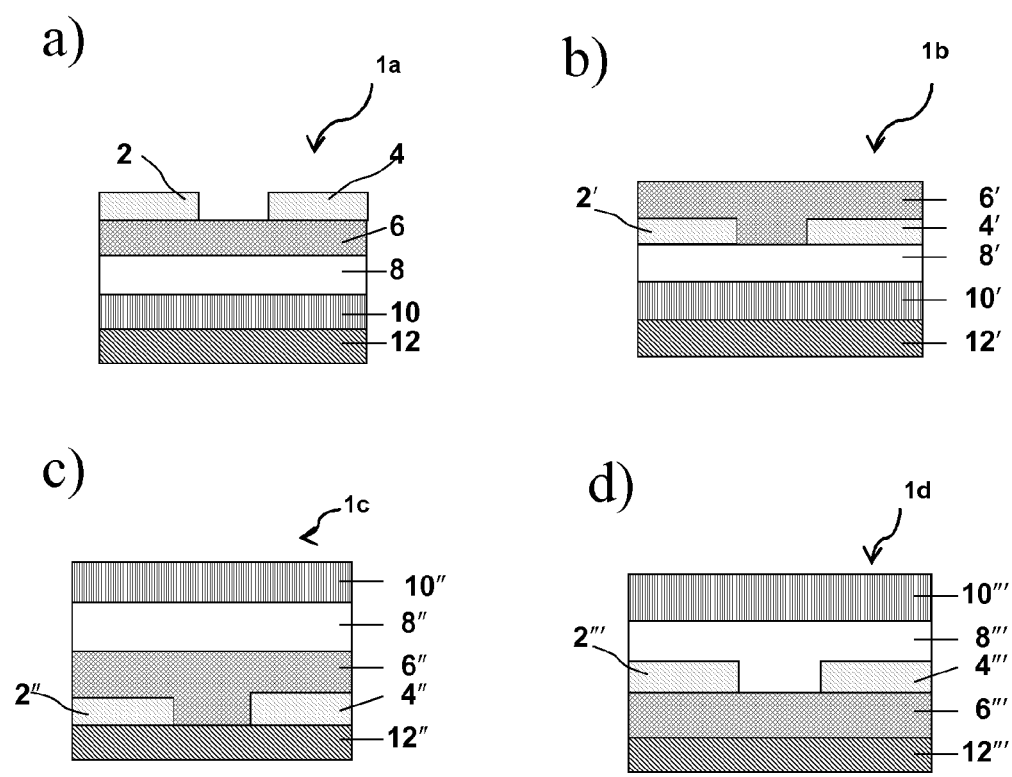
FIG. 1 illustrates four different configurations of thin film transistors: a) bottom-gate top contact, b) bottom-gate bottom-contact, c) top-gate bottom-contact, and d) top-gate top-contact; each of which can be used to incorporate one or more polymers of the present teachings, particularly as the channel (semiconductor) materials.

The present teachings provide organic semiconductor materials that include organic semiconducting polymers and associated compositions, composites, and/or devices. Polymers of the present teachings can exhibit semiconductor behavior such as high carrier mobility and/or good current modulation characteristics in a field-effect device, light absorption/charge separation in a photovoltaic device, and/or charge transport/recombination/light emission in a light-emitting device. In addition, the present polymers can possess certain processing advantages such as solution-processability and/or good stability (for example, air stability) in ambient conditions. Further, the polymers can be embedded with other components for utilization in other semiconductor-based devices. The polymers of the present teachings can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

Accordingly, one aspect of the present teachings provides polymers having semiconducting activity and semiconductor materials prepared from these polymers. More specifically, the polymers can be A-B copolymers comprising a first repeating unit (monomer A) that includes an aromatic imide or a derivative thereof, and a second repeating unit (monomer B) that includes one or more electron-accepting or electron-donating cyclic moieties. Both monomer A and monomer B typically include an aromatic or otherwise highly conjugated cyclic (carbocyclic or heterocyclic) core, where such cyclic core can be optionally substituted or functionalized with one or more electron-withdrawing or electron-donating groups. The pairing of monomers A and B, the imide position functionalization of monomer A, and any additional functionalization on either monomer can be affected by one or more of the following considerations: 1) the electron-withdrawing capability for semiconductor processing in air and stable charge transport operation; 2) modulation of the majority carrier type depending on the electronic structure of monomers A and B; 3) regiochemistry of the polymerization possibly affording regioregular polymers; 4) the core planarity and linearity of the polymer chain; 5) the capability of additional functionalization of the π-conjugated core; 6) the potential for increased solubility of the polymer for solution processing; 7) achieving strong π-π (interactions/intermolecular electronic coupling; and 8) bandgap modulation via electron donor-acceptor coupling of electron-poor (acceptor) and electron-rich (donor) A-B or B-A repeating units. The resulting polymers and related methods can be employed to enhance the performance of an associated device (e.g., an organic field effect transistor, a light-emitting transistor, a solar cell, or the like).

In particular, the present teachings provide polymers having semiconducting activity, wherein the polymers can be generally described as A-B copolymers where monomer A comprises an optionally substituted aryl or heteroaryl imide (or an imide derivative) and monomer B comprises one or more optionally substituted aromatic or otherwise conjugated cyclic moieties. Within monomer B, the one or more optionally substituted aromatic moieties can be linked among themselves or to monomer A via a linker as described herein. It should be understood that the polymers of the present teachings can be referred herein as either homopolymers or copolymers of monomer A. Each of monomer A and monomer B can be optionally substituted or functionalized with one or more electron-donating or electron-accepting (electron-withdrawing) groups.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, "solution-processable" refers to polymers, materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

As used herein, a "polymer" or "polymeric compound" refers to a molecule (e.g., a macromolecule) including a plurality of repeating units connected by covalent chemical bonds. A polymer can be represented by the general formula:

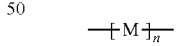

wherein M is the repeating unit or monomer, and n is the number of M's in the polymer. For example, if n is 3, the polymer shown above is understood to be:

The polymer or polymeric compound can have only one type of repeating unit as well as two or more types of different repeating units. In the former case, the polymer can be referred to as a homopolymer. In the latter case, the term "copolymer" or "copolymeric compound" can be used instead, especially when the polymer includes chemically significantly different repeating units. The polymer or polymeric compound can be linear or branched. Branched polymers can include dendritic polymers, such as dendronized polymers, hyperbranched polymers, brush polymers (also called bottle-brushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

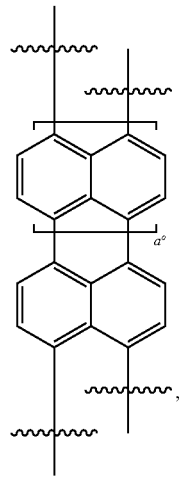

where a° can be an integer in the range of 0-3; coronenes (or analogs thereof containing one or more heteroatoms) having the formula:

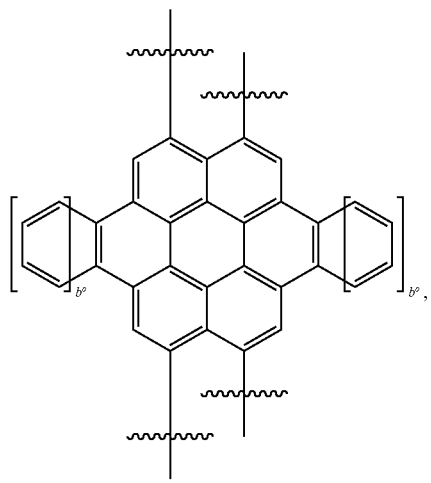

where b° can be an integer in the range of 0-3; and linear acenes (or analogs thereof containing one or more heteroatoms) having the formula:

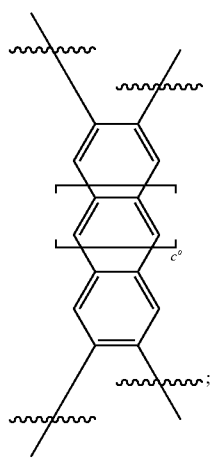

where c° can be an integer in the range of 0-4. The fused ring moiety can be optionally substituted as described herein.

As used herein, a "cyclic moiety" can include one or more (e.g., 1-6) carbocyclic or heterocyclic rings. In embodiments where the cyclic moiety is a "polycyclic moiety," the "polycyclic moiety" can include two or more rings fused to each other (i.e., sharing a common bond) and/or connected to each other via a spiro atom. The cyclic moiety can be a cycloalkyl group, a heterocycloalkyl group, an aryl group, or a heteroaryl group (i.e., can include only saturated bonds, or can include one or more unsaturated bonds regardless of aromaticity), and can be optionally substituted as described herein. In embodiments where the cyclic moiety is a "monocyclic moiety," the "monocyclic moiety" can include a 3-20 membered carbocyclic or heterocyclic ring. A monocyclic moiety can include a $C_{6-20}$ aryl group (e.g., $C_{6-14}$ aryl group) or a 5-20 membered heteroaryl group (e.g., 5-14 membered heteroaryl group), each of which can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $—C_zH_{2z+1-t}X^0{}_t$, where $X^0$, at each occurrence, is F, Cl, Br or I, z is an integer in the range of 1 to 40, and t is an integer in the range of 1 to 81, provided that t is less than or equal to $2z+1$. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a $—Y—C_{6-14}$ aryl group, where Y is as defined herein. An example of an arylalkyl group is a benzyl group ($—CH_2—C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 20 carbon atoms, for example, 3 to 14 carbon atoms (i.e., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 20 ring atoms, for example, 3 to 14 ring atoms (i.e., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 22 carbon atoms in its ring system (e.g., $C_{6-14}$ aryl group), which can include multiple fused rings. In some embodiments, a polycyclic aryl group can have from 8 to 22 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic) and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $—C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, 5 to 22 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

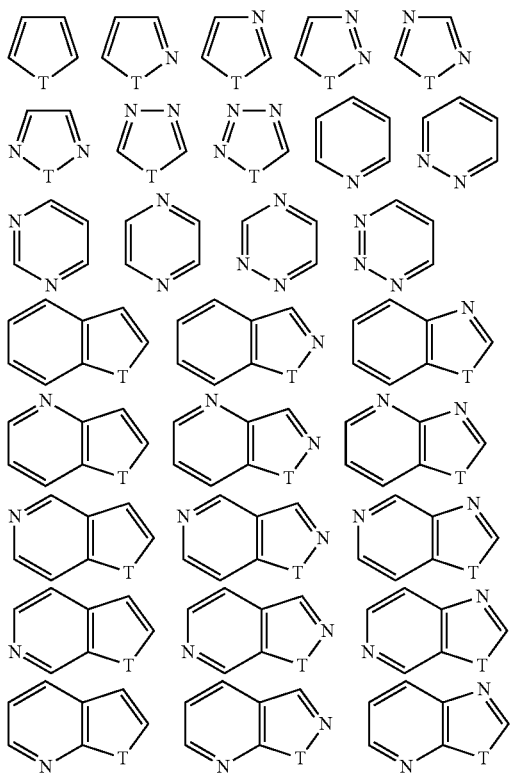

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Polymers of the present teachings can include a "divalent group" defined herein as a linking group capable of forming a covalent bond with two other moieties. For example, polymers of the present teachings can include a divalent C$_{1-20}$ alkyl group (e.g., a methylene group), a divalent C$_{2-20}$ alkenyl group (e.g., a vinylyl group), a divalent C$_{2-20}$ alkynyl group (e.g., an ethynylyl group). a divalent C$_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group).

The electron-donating or electron-withdrawing properties of several hundred of the most common substituents, reflecting all common classes of substituents have been determined, quantified, and published. The most common quantification of electron-donating and electron-withdrawing properties is in terms of Hammett a values. Hydrogen has a Hammett a value of zero, while other substituents have Hammett a values that increase positively or negatively in direct relation to their electron-withdrawing or electron-donating characteristics. Substituents with negative Hammett a values are considered electron-donating, while those with positive Hammett a values are considered electron-withdrawing. See Lange's Handbook of Chemistry, 12th ed., McGraw Hill, 1979,Table 3-12, pp. 3-134 to 3-138,which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —NO$_2$, —CN, —NC, —S(R$^0$)$_2$$^+$, —N(R$^0$)$_3$$^+$, —SO$_3$H, —SO$_2$R$^0$, —SO$_3$R$^0$, —SO$_2$NHR$^0$, —SO$_2$N(R$^0$)$_2$, —COOH, —COR$^0$, —COOR$^0$, —CONHR$^0$, —CON(R$^0$)$_2$, C$_{1-40}$ haloalkyl groups, C$_{6-14}$ aryl groups, and 5-14 membered electron-poor heteroaryl groups; where R$^0$ is a C$_{1-20}$ alkyl group, a C$_{2-20}$ alkenyl group, a C$_{2-20}$ alkynyl group, a C$_{1-20}$ haloalkyl group, a C$_{1-20}$ alkoxy group, a C$_{6-14}$ aryl group, a C$_{3-14}$ cycloalkyl group, a 3-14 membered cycloheteroalkyl group, and a 5-14 membered heteroaryl group, each of which can be optionally substituted as described herein. For example, each of the C$_{1-20}$ alkyl group, the C$_{2-20}$ alkenyl group, the C$_{2-20}$ alkynyl group, the C$_{1-20}$ haloalkyl group, the C$_{1-20}$ alkoxy group, the C$_{6-14}$ aryl group, the C$_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —NO$_2$, —CN, —NC, —S(R$^0$)$_2$$^+$, —N(R$^0$)$_3$$^+$, —SO$_3$H, —SO$_2$R$^0$, —SO$_3$R$^0$, —SO$_2$NHR$^0$, —SO$_2$N(R$^0$)$_2$, —COOH, —COR$^0$, —COOR$^0$, —CONHR$^0$, and —CON(R$^0$)$_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —OR$^0$, —NH$_2$, —NHR$^0$, —N(R$^0$)$_2$, and 5-14 membered electron-rich heteroaryl groups, where R⁰ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents of monomers A and B are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40,and an integer in the range of 1 to 20 is specifically intended to individually disclose 1, 2, 3, 4, 5, 6, 7, 8, 9, 10, 11, 12, 13, 14, 15, 16, 17, 18, 19,and 20.Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4,and 4-5 substituents.

Polymers described herein can contain an asymmetric atom (also referred as a chiral center) and some of the polymers can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of polymers containing alkenyl moieties (e.g., alkenes, azo, and imines). It also should be understood that the polymers of the present teachings encompass all possible regioisomers in pure form and mixtures thereof. It may be possible to separate such isomers, for example, using standard separation procedures known to those skilled in the art, for example, column chromatography, thin-layer chromatography, simulated moving-bed chromatography, and high-performance liquid chromatography. However, mixtures of regioisomers can be used similarly to the uses of each individual regioisomer of the present teachings.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm²/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm²/Vs. In the case of field-effect devices, an n-type semiconductor can also exhibit a current on/off ratio of greater than about 10.

As used herein, "field effect mobility" refers to a measure of the velocity with which charge carriers, for example, holes (or units of positive charge) in the case of a p-type semiconductor material and electrons in the case of an n-type semiconductor material, move through the material under the influence of an electric field.

At various places in the present application, temperatures are disclosed in ranges. It is specifically intended that the description includes narrower ranges of temperatures within such ranges, as well as the maximum and minimum temperatures embracing such ranges of temperatures including any equivalents thereof.

In various embodiments, the polymers of the present teachings can have the formula:

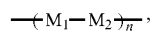

wherein $M_1$ has the formula:

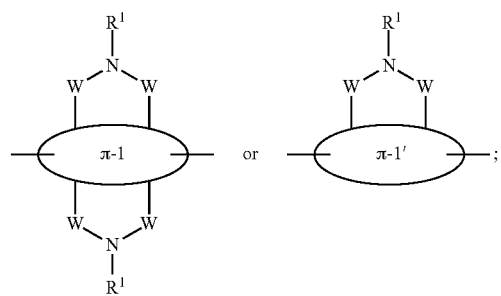

$M_2$ has a formula selected from:

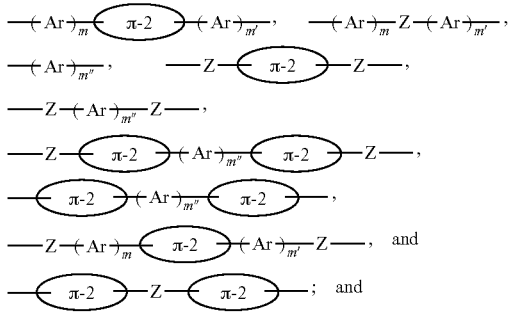

n is an integer greater than 2; and
π-1,π-1', π-2,Ar, $R^1$, W, Z, m, m', and m" are as defined herein.
More specifically, in the formula of $M_1$ selected from:

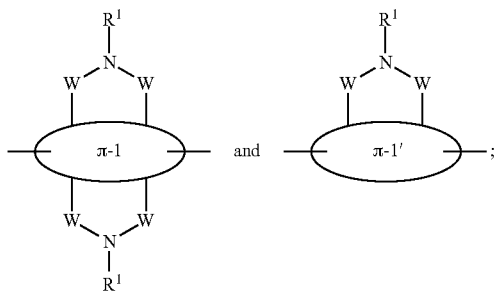

π-1 and π-1' are an optionally substituted fused ring moiety;
$R^1$, at each occurrence, is independently selected from H, a $C_{1-40}$ alkyl group, a $C_{2-40}$ alkenyl group, a $C_{2-40}$ alkynyl group, a $C_{1-40}$ haloalkyl group, -L-$R^a$, -L-$Ar^1$, -L-$Ar^1$—$Ar^1$, -L-$Ar^1$—$R^a$, -L-$Ar^1$—$Ar^1$—$R^a$, -L-$Cy^1$, -L-$Cy^1$-$Cy^1$, -L-$Cy^1$-$R^a$, and -L-$Cy^1$-$Cy^1$-$R^a$;
wherein:
L, at each occurrence, is independently selected from —O—, —Y—O—Y—, —S—, —S(O)—, —Y—S—Y—, —C(O)—, —NR$^c$(O)—, —C(O)NR$^c$—, —NR$^c$—, —SiR$^c$$_2$—, —Y—[SiR$^c$$_2$]—Y—, a divalent $C_{1-20}$ alkyl group, a divalent $C_{1-20}$ alkenyl group, a divalent $C_{1-20}$ haloalkyl group, and a covalent bond;
$Ar^1$, at each occurrence, is independently a $C_{6-14}$ aryl group or a 5-14 membered heteroaryl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group;
$Cy^1$, at each occurrence, is independently a $C_{3-14}$ cycloalkyl group or a 3-14 membered cycloheteroalkyl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group; and
Ra, at each occurrence, is independently selected from a $C_{1-40}$ alkyl group, a $C_{2-40}$ alkenyl group, a $C_{2-40}$ alkynyl group, a $C_{1-40}$ haloalkyl group, a $C_{1-40}$ alkoxy group, -L'-$R^b$, -L'-$Ar^2$, -L'-$Ar^2$—$Ar^2$, -L'-$Ar^2$—$R^b$, -L'-$Ar^2$—$Ar^2$—$R^b$, -L'-$Cy^2$, -L'-$Cy^2$-$Cy^2$, -L'-$Cy^2$-$R^b$, -L'-$Cy^2$-$Cy^2$-$R^b$;
wherein:
L', at each occurrence, is independently selected from —O—, —Y—O—Y—, —S—, —S(O)—, —Y—S—Y—, —C(O)—, —NR$^c$C(O)—, —C(O)NR$^c$—, —NR$^c$—, —SiR$^c$$_2$—, —Y—[SiR$^c$$_2$]—Y—, a divalent $C_{1-20}$ alkyl group, a divalent $C_{1-20}$ alkenyl group, a divalent $C_{1-20}$ haloalkyl group, and a covalent bond;
$Ar^2$, at each occurrence, is independently a $C_{6-14}$ aryl group or a 5-14 membered heteroaryl group, each optionally substituted with 1-5 substituents independently selected from halogen, —CN, oxo, =C(CN)$_2$, a $C_{1-6}$ alkyl group, a $C_{1-6}$ alkoxy group, and a $C_{1-6}$ haloalkyl group;
$Cy^2$, at each occurrence, is independently a $C_{3-14}$ cycloalkyl group or a 3-14 membered cycloheteroalkyl group, each optionally substituted with 1-5 substituents independently selected from a halogen, —CN, oxo, =C(CN)$_2$, a $C_{1-6}$ alkyl group, a $C_{1-6}$ alkoxy group, and a $C_{1-6}$ haloalkyl group;
$R^b$, at each occurrence, is independently selected from a $C_{1-40}$ alkyl group, a $C_{2-40}$ alkenyl group, a $C_{2-40}$ alkynyl group, a $C_{1-40}$ haloalkyl group, and a $C_{1-40}$ alkoxy group;
$R^c$, at each occurrence, is independently selected from H, a $C_{1-6}$ alkyl group, and a —Y—$C_{6-14}$ aryl group; and
Y, at each occurrence, is independently selected from a divalent $C_{1-6}$ alkyl group, a divalent $C_{1-6}$ haloalkyl group, and a covalent bond; and
W, at each occurrence, is independently C(O) or a covalent bond; or
alternatively, W and $R^1$ together with the nitrogen atom therebetween form a 5-14 membered cyclic moiety optionally substituted with 1-4 $R^d$ groups;
wherein:
$R^d$, at each occurrence, is a) halogen, b) —CN, c) —NO$_2$, d) oxo, e) =C($R^e$)$_2$, f) a $C_{1-40}$ alkyl group, g) a $C_{2-40}$ alkenyl group, h) a $C_{2-40}$ alkynyl group, i) a $C_{1-40}$ haloalkyl group, j) a —Y—$C_{3-10}$ cycloalkyl group, k) a —Y—$C_{6-14}$ aryl group, l) a —Y—$C_{6-14}$ haloaryl group, m) a —Y-3-12 membered cycloheteroalkyl group, or n) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^e$ groups; and
$R^e$, at each occurrence, is selected from a) halogen, b) —CN, c) —NO$_2$, d) oxo, e) —OH, f) —O—$C_{1-20}$ alkyl, g) —O—$C_{6-14}$ aryl, h) —NH$_2$, i) —NH($C_{1-20}$ alkyl), j) —N($C_{1-20}$ alkyl)$_2$, k) —N($C_{1-20}$ alkyl)-$C_{6-14}$ aryl, l) —N($C_{6-14}$ aryl)$_2$, m) —S(O)$_m$H, n) —S(O)$_m$—$C_{1-20}$ alkyl, o) —S(O)$_2$OH, p) —S(O)$_m$—O$C_{1-20}$ alkyl, q) —S(O)$_m$—O$C_{6-14}$ aryl, r) —CHO, s) —C(O)—$C_{1-20}$ alkyl, t) —C(O)—$C_{6-14}$ aryl, u) —C(O)OH, v) —C(O)—O$C_{1-20}$ alkyl, w) —C(O)—O$C_{6-14}$ aryl, x) —C(O)NH$_2$, y) —C(O)NH—$C_{1-20}$ alkyl, z) —C(O)N($C_{1-20}$ alkyl)$_2$, aa) —C(O)NH—$C_{6-14}$ aryl, ab) —C(O)N($C_{1-20}$ alkyl)—$C_{6-14}$ aryl, ac) —C(O)N($C_{6-14}$ aryl)$_2$, ad) —C(S)NH$_2$, ae) —C(S)NH—$C_{1-20}$ alkyl, af) —C(S)N($C_{1-20}$ alkyl)$_2$, ag) —C(S)N($C_{6-14}$ aryl)$_2$, ah) —C(S)N($C_{1-20}$ alkyl)—$C_{6-14}$ aryl, ai) —C(S)NH—$C_{6-14}$ aryl, aj) —S(0)$_m$NH$_2$, ak) —S(O)$_m$NH($C_{1-20}$ alkyl), al) —S(O)$_m$N($C_{1-20}$ alkyl)$_2$, am) —S(O)$_m$NH($C_{6-14}$ aryl), an) —S(O)$_m$N($C_{1-20}$ alkyl)—$C_{6-14}$ aryl, ao) —S(O)$_m$N($C_{6-14}$ aryl)$_2$, ap) —SiH$_3$, aq) —SiH($C_{1-20}$ alkyl)$_2$, ar) —SiH$_2$($C_{1-20}$ alkyl), as) —Si($C_{1-20}$ alkyl)$_3$, at) a $C_{1-20}$ alkyl group, au) a $C_{2-20}$ alkenyl group, av) a $C_{2-20}$ alkynyl group, aw) a C$_{1-20}$ alkylthio group, ax) a C$_{1-20}$ haloalkyl group, ay) a C$_{3-10}$ cycloalkyl group, az) a C$_{6-14}$ aryl group, ba) a C$_{6-14}$ haloaryl group, bb) a 3-12 membered cycloheteroalkyl group, and bc) a 5-14 membered heteroaryl group.

In various embodiments, π-1 can be a polycyclic aromatic hydrocarbon (e.g., naphthalene, anthracene, tetracene, pentacene, perylene, pyrene, coronene) having the appropriate valence to form covalent bonds with the two nitrogen-containing end groups and with two neighboring repeating units (or one neighboring repeating unit if at the terminal position). In some embodiments, one or more (e.g., 1-4) carbon ring atoms of the polycyclic aromatic hydrocarbon can be replaced with a heteroatom such as S, Se, Si, N, or P (i.e., heteroaryl). In certain embodiments, π-1 can be optionally substituted with 1-6 substituents independently selected from a) an electron-withdrawing group and b) a C$_{1-40}$ alkyl group optionally substituted with 1-5 electron-withdrawing groups. In some embodiments, π-1 can be optionally substituted with 1-6 R$^d$ groups, wherein R$^d$ is as defined herein.

In various embodiments, π-1' can be an optionally substituted polycyclic aromatic hydrocarbon (e.g., naphthalene, anthracene, tetracene, pentacene, perylene, pyrene, coronene) having the appropriate valence to form covalent bonds with a nitrogen-containing end group and with two neighboring repeating units (or one neighboring repeating unit if at the terminal position). In some embodiments, one or more (e.g., 1-4) carbon ring atoms of the polycyclic aromatic hydrocarbon can be replaced with a heteroatom such as S, Se, Si, N, or P (i.e., heteroaryl). In certain embodiments, π-1' can be optionally substituted with 1-8 substituents independently selected from a) an electron-withdrawing group and b) a C$_{1-40}$ alkyl group optionally substituted with 1-5 electron-withdrawing groups. For example, π-1' can be optionally substituted with 1-8 R$^d$ groups, wherein R$^d$ is as defined herein.

In various embodiments, each nitrogen-containing end group typically includes at least one carbonyl moiety. Accordingly, in some embodiments, each nitrogen-containing end group can be an imide moiety, that is, W, at each occurrence, is C(O). In other embodiments, the nitrogen-containing end group can be an imide derivative, that is, for example, one of the two W groups can be a covalent bond, or alternatively, one of the two W groups can cyclicize with the R$^1$ group and the nitrogen atom therebetween to provide a 5-14 membered cyclic moiety which can be optionally substituted as disclosed herein.

In particular embodiments, M$_1$ can be selected from:

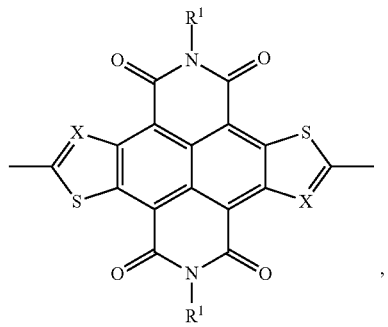

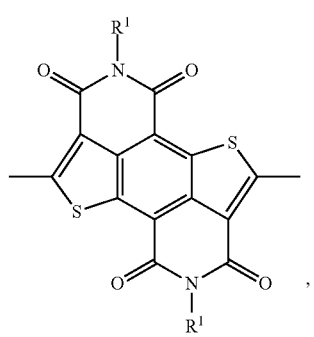

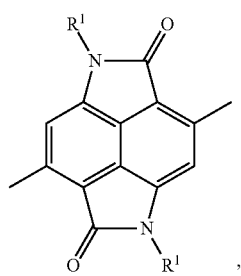

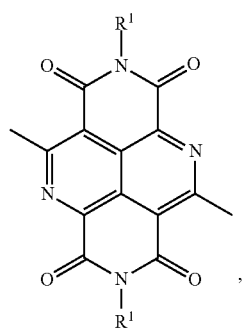 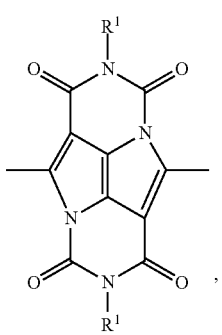 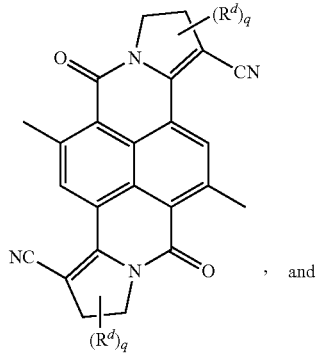

, and

17
-continued

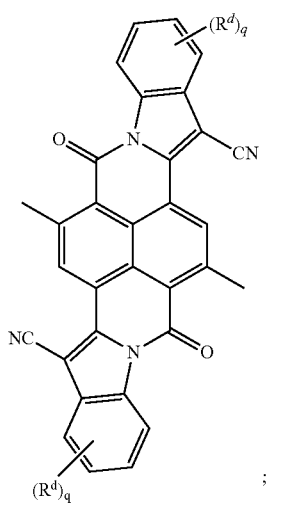

wherein:

X is N, CH or CR$^d$;

q is 0, 1, 2 or 3; and

R$^1$ and R$^d$ are as defined herein.

In some embodiments, substitution of alkyl chains (and similar groups such as haloalkyl groups, arylalkyl groups, heteroarylalkyl groups and so forth) on one or both imide nitrogen atoms can improve solubility of the polymer in an organic solvent. Accordingly, in certain embodiments, R$^1$ can be a linear or branched C$_{3-40}$ alkyl group, examples of which include an n-hexyl group, a 1-methylhexyl group, a 2-ethylhexyl group, and a 2-octyldodecyl group. In certain embodiments, R$^1$ can be a linear or branched C$_{3-40}$ alkenyl group. In particular embodiments, R$^1$ can be a branched C$_{3-20}$ alkyl group or a branched C$_{3-20}$ alkenyl group. For example, R$^1$, at each occurrence, independently can be selected from:

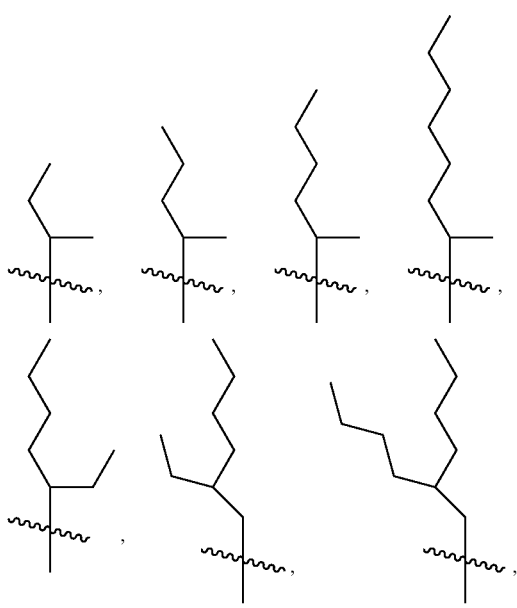

18
-continued

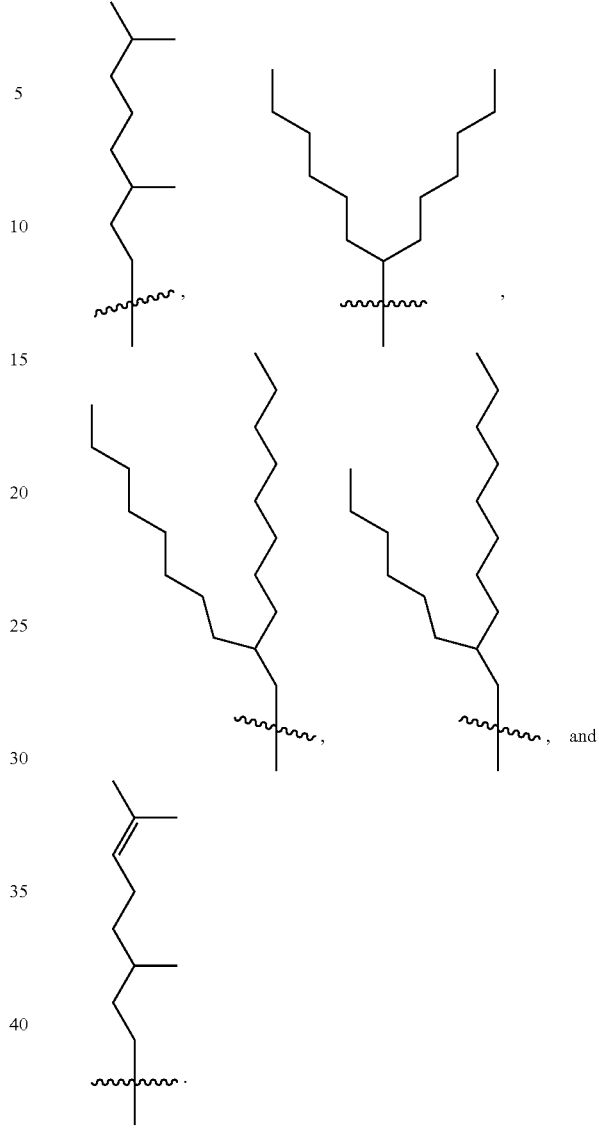
and

In certain embodiments, R$^1$, at each occurrence, can be a linear or branched C$_{6-40}$ alkyl or alkenyl group, an arylalkyl group optionally substituted with a linear or branched C$_{6-40}$ alkyl or alkenyl group, an aryl group (e.g., a phenyl group) substituted with a linear or branched C$_{6-40}$ alkyl or alkenyl group, or a biaryl group (e.g., a biphenyl group) optionally substituted with a linear or branched C$_{6-40}$ alkyl or alkenyl group, wherein each of these groups optionally can be substituted with 1-5 halo groups (e.g., F). In some embodiments, R$^1$ can be a biaryl group wherein the two aryl groups are covalently linked via a linker (L'). For example, the linker can be a divalent C$_{1-6}$ alkyl group or a carbonyl group. In particular embodiments, at each occurrence, independently can be selected from:

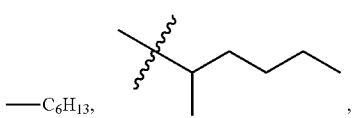
—C$_6$H$_{13}$,

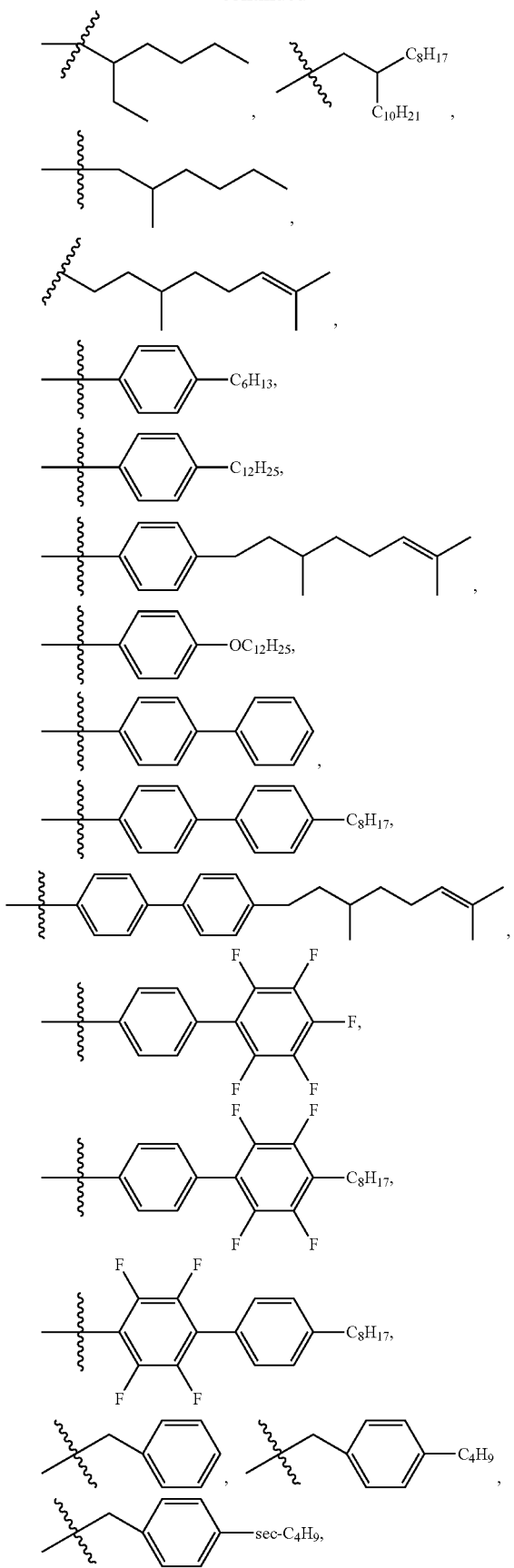

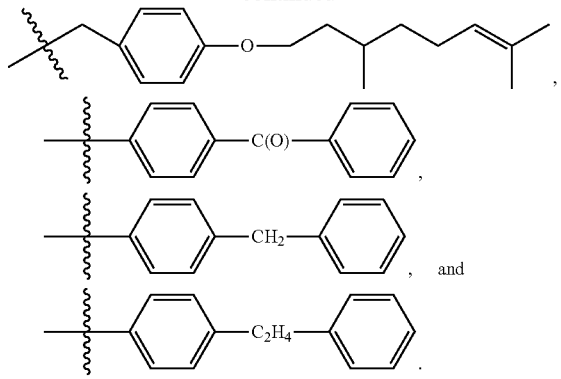

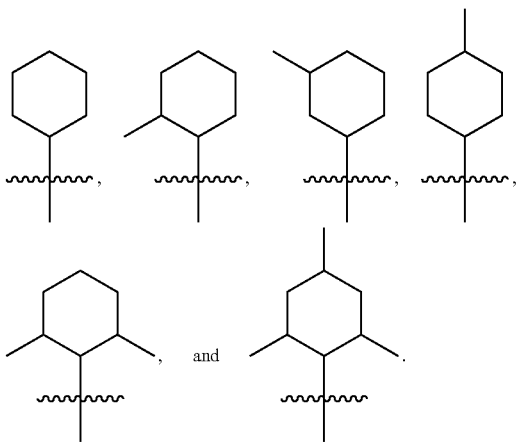

In some embodiments, $R^1$ can be an optionally substituted $C_{6-14}$ cycloalkyl group. For example, $R^1$, at each occurrence, independently can be selected from:

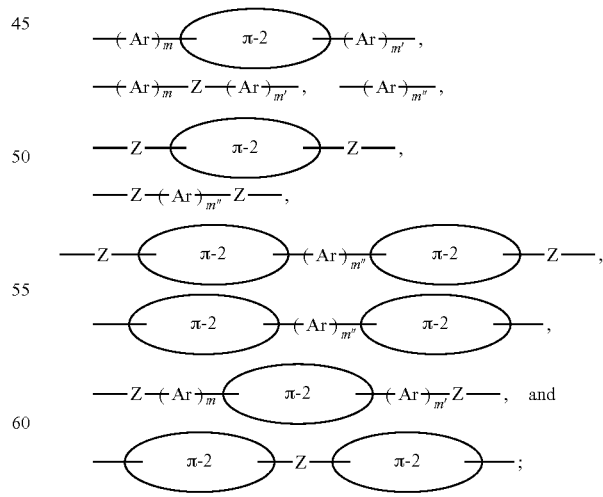

In various embodiments, the polymers of the present teachings can include a comonomer $M_2$ having a formula selected from:

wherein:
π-2 is an optionally substituted fused ring moiety;
Ar, at each occurrence, is independently an optionally substituted 5- or 6-membered aryl or heteroaryl group;

Z is a conjugated linear linker; and m, m' and m" independently are 0, 1, 2, 3, 4, 5 or 6.

In some embodiments, π-2 can be an optionally substituted polycyclic $C_{8-22}$ aryl group or 8-22 membered heteroaryl group. For example, π-2 can have a planar and highly conjugated cyclic core which can be optionally substituted as disclosed herein. In various embodiments, π-2 can have a reduction potential (versus an SCE electrode and measured in, for instance, a THF solution) greater than (i.e., more positive than) about −3.0 V. In certain embodiments, π-2 can have a reduction potential greater than or equal to about −2.2 V. In particular embodiments, π-2 can have a reduction potential greater than or equal to about −1.2 V. Examples of suitable cyclic cores include naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P. In certain embodiments, π-2 can include at least one electron-withdrawing group.

In certain embodiments, π-2 can include two or more (e.g., 2-4) fused rings where each ring can be a five-, six-, or seven-membered ring optionally substituted with 1-6 $R^e$ groups, wherein $R^e$ is as defined herein. For example, $R^e$ can be selected from an oxo group, a cyano group, and $=C(CN)_2$. In some embodiments, π-2 can include a monocyclic ring (e.g., a 1,3-dioxolane group or a derivative thereof including optional substituents and/or ring heteroatoms) covalently bonded to a second monocyclic ring or a polycyclic system via a spiroatom (e.g., a spiro carbon atom).

In some embodiments, π-2 can be selected from:

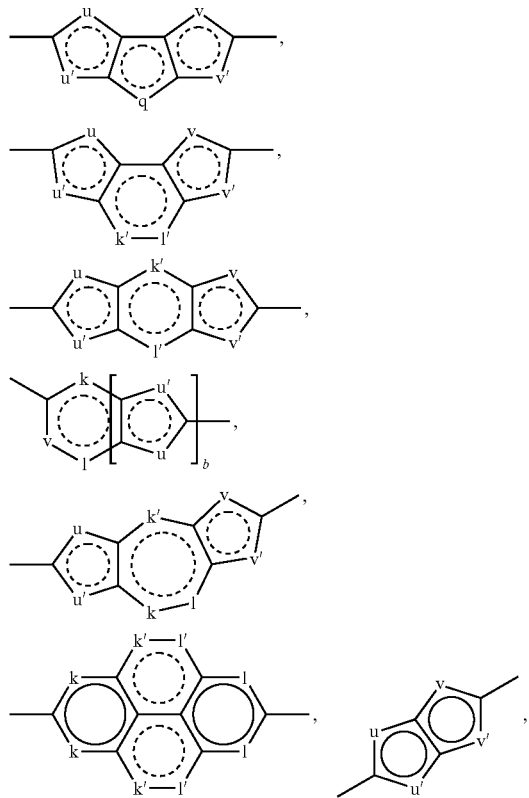

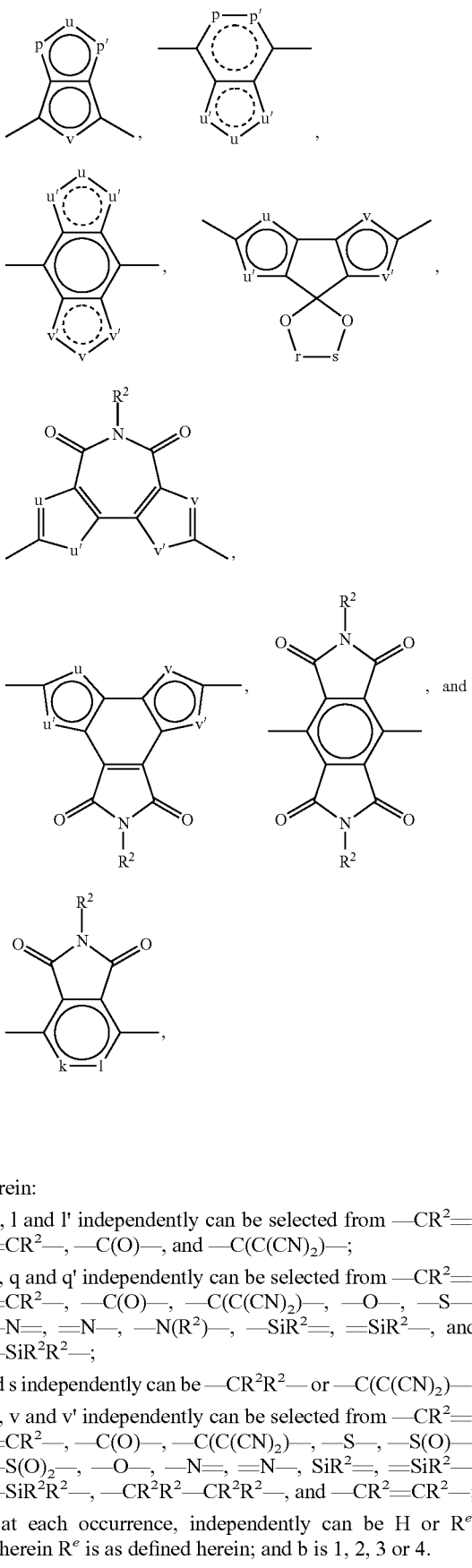

wherein:

k, k', l and l' independently can be selected from $—CR^2=$, $=CR^2—$, $—C(O)—$, and $—C(C(CN)_2)—$;

p, p', q and q' independently can be selected from $—CR^2=$, $=CR^2—$, $—C(O)—$, $—C(C(CN)_2)—$, $—O—$, $—S—$, $—N=$, $=N—$, $—N(R^2)—$, $—SiR^2=$, $=SiR^2—$, and $—SiR^2R^2—$;

r and s independently can be $—CR^2R^2—$ or $—C(C(CN)_2)—$;

u, u', v and v' independently can be selected from $—CR^2=$, $=CR^2—$, $—C(O)—$, $—C(C(CN)_2)—$, $—S—$, $—S(O)—$, $—S(O)_2—$, $—O—$, $—N=$, $=N—$, $SiR^2=$, $=SiR^2—$, $—SiR^2R^2—$, $—CR^2R^2—CR^2R^2—$, and $—CR^2=CR^2—$;

$R^2$, at each occurrence, independently can be H or $R^e$, wherein $R^e$ is as defined herein; and b is 1, 2, 3 or 4.

In certain embodiments, π-2 can be selected from:
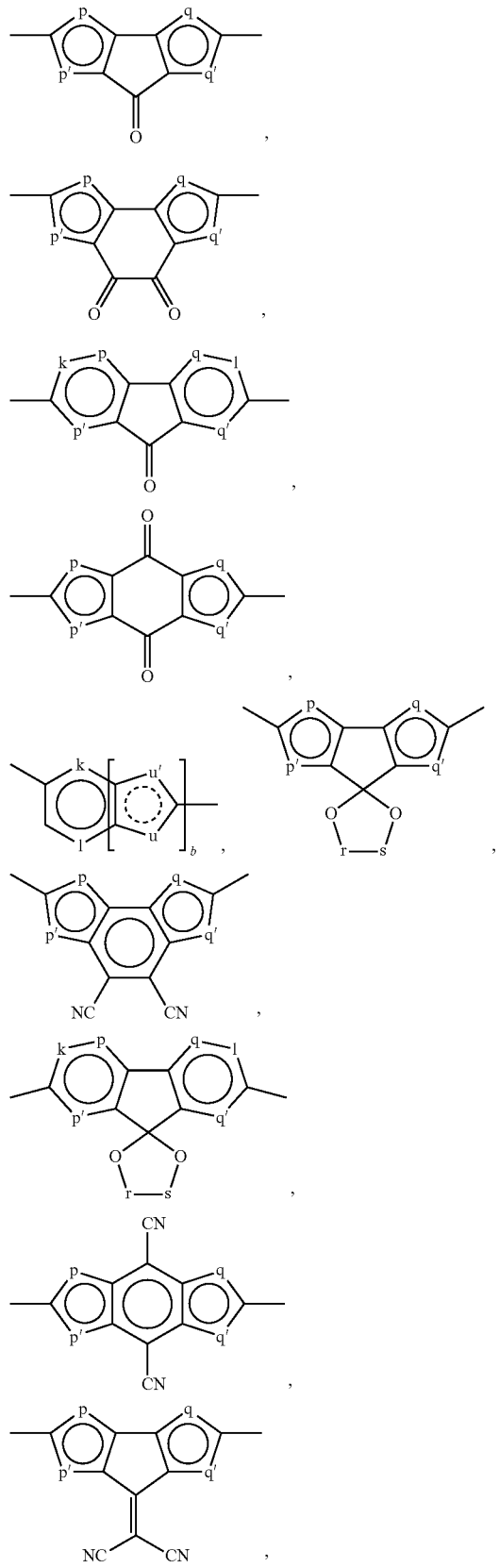
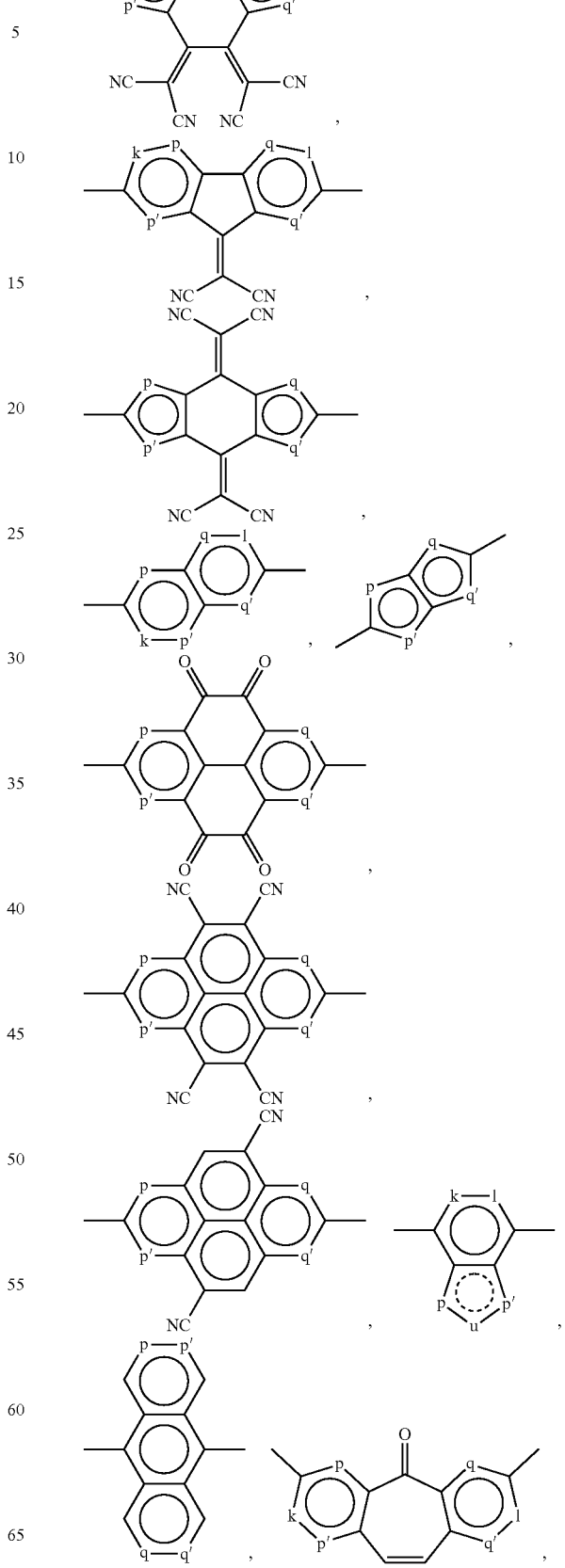

where each of these groups can be optionally substituted as disclosed herein. For example, π-2 can be selected from:

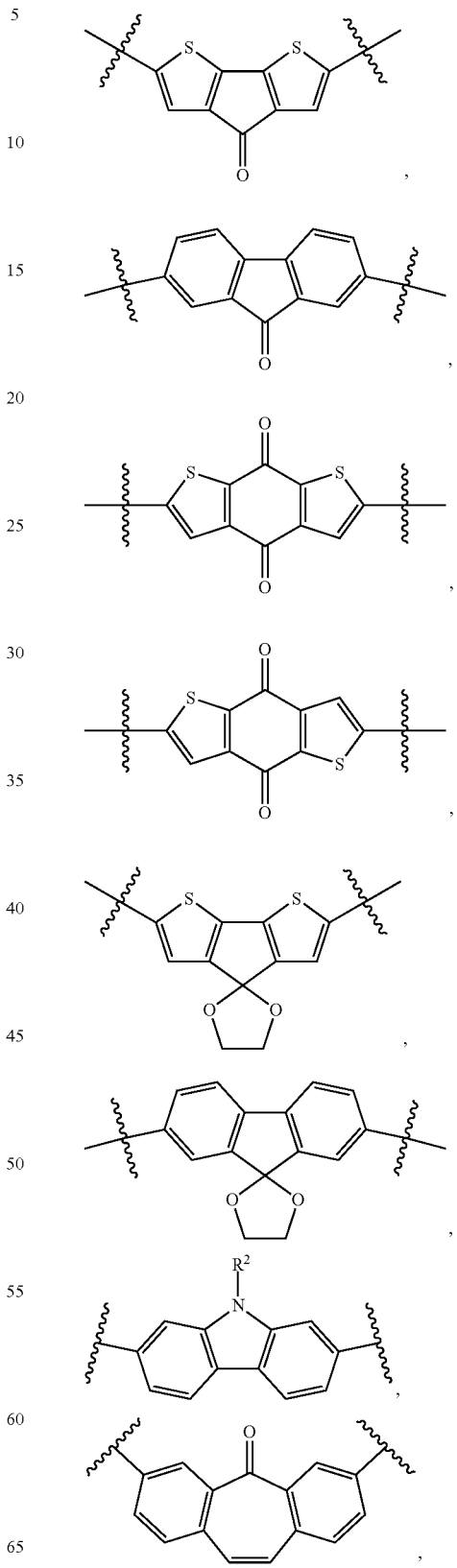

where b, k, l, p, p', q, q', r, s and $R^2$ are as defined herein. In some embodiments, k and l independently can be selected from —$CR^2$=, =$CR^2$—, and —C(O)—; p, p', q, and q' independently can be selected from —O—, —S—, —N($R^2$)—, —N=, =N—, —$CR^2$=, and =$CR^2$—; u and v independently can be selected from —$CR^2$=, =$CR^2$—, —C(O)—, —C(C(CN)$_2$)—, —S—, —O—, —N=, =N—, —$CR^2R^2$—$CR^2R^2$—, and —$CR^2$=$CR^2$—; where $R^2$ is as defined herein. For example, $R^2$, at each occurrence, independently can be selected from H, a halogen, —CN, —$OR^c$, —N($R^c$)$_2$, a $C_{1-20}$ alkyl group, and a $C_{1-20}$ haloalkyl group, where $R^c$ is as defined herein. Each of r and s can be CH$_2$.

In certain embodiments, π-2 can be a polycyclic moiety including one or more thienyl, thiazolyl, or phenyl groups,

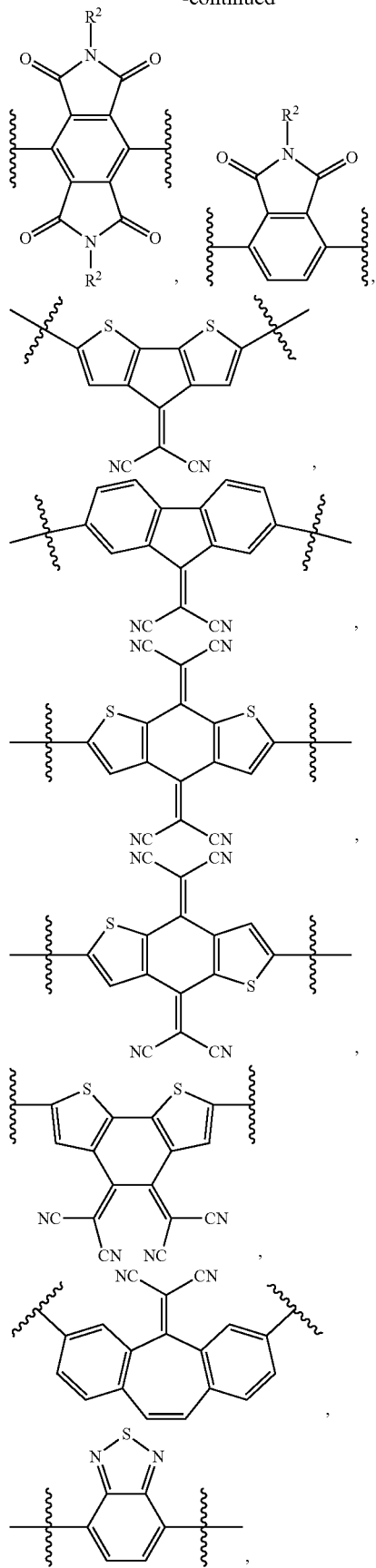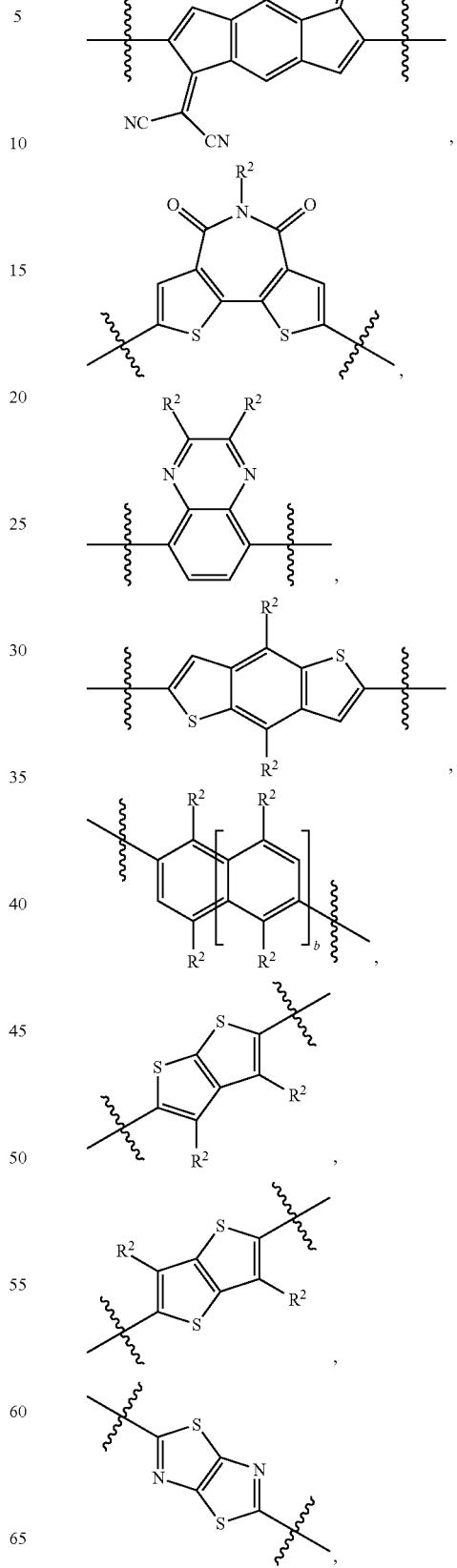

-continued

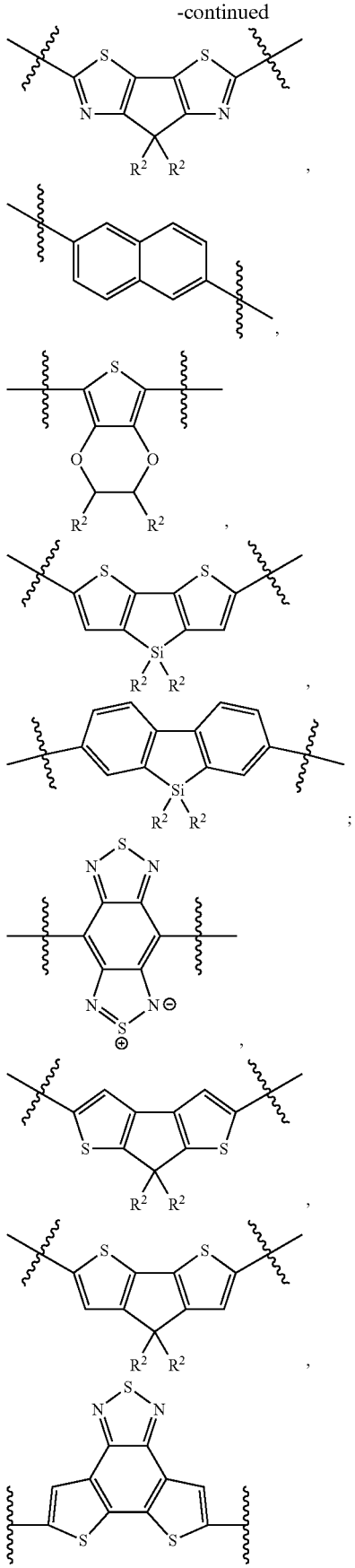

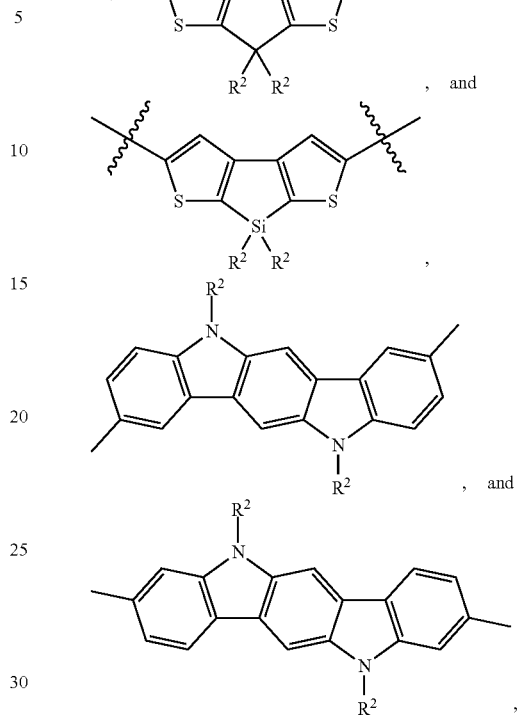

wherein $R^2$ and b are as defined herein. For example, $R^2$ can be selected from a $C_{1-20}$ alkyl group, a $C_{1-20}$ alkoxy group, and a $C_{1-20}$ haloalkyl group.

In some embodiments, Ar, at each occurrence, independently can be selected from:

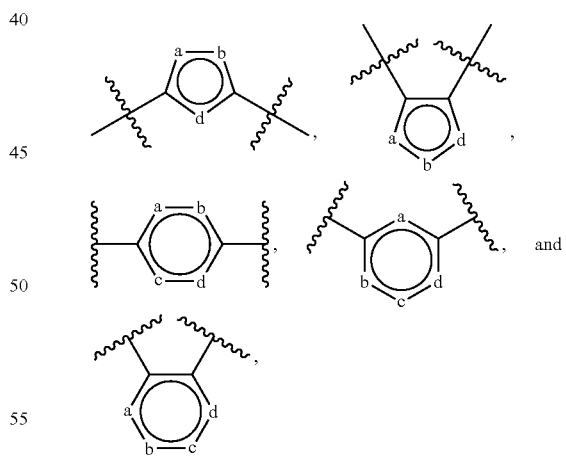

wherein:
a, b, c and d independently are selected from —S—, —O—, —CH=, =CH—, —CR³=, =CR³—, —C(O)—, —C(C(CN)₂)—, —N=, =N—, —NH— and —NR³—;
$R^3$, at each occurrence, is independently selected from a) halogen, b) —CN, c) —NO₂, d) —N(R$^c$)₂, e) —OR$^c$, f) —C(O)R$^c$, g) —C(O)OR$^c$, h) —C(O)N(R$^c$)₂, i) a $C_{1-40}$ alkyl group, j) a $C_{2-40}$ alkenyl group, k) a $C_{2-40}$ alkynyl group, l) a $C_{1-40}$ alkoxy group, m) a $C_{1-40}$ alkylthio group, n) a $C_{1-40}$ haloalkyl group, o) a —Y—$C_{3-14}$ cycloalkyl group, p) a —Y—$C_{6-14}$ aryl group, q) a —Y-3-14 membered cycloheteroalkyl group, and r) a —Y-5-14 membered heteroaryl group, wherein each of the $C_{1-40}$ alkyl group, the $C_{2-40}$ alkenyl group, the $C_{2-40}$ alkynyl group, the $C_{3-14}$ cycloalkyl group, the $C_{6-14}$ aryl group, the 3-14 membered cycloheteroalkyl group, and the 5-14 membered heteroaryl group optionally is substituted with 1-5 $R^e$ groups; and Y, $R^c$ and $R^e$ are as defined herein.

Depending on whether it is located within the polymeric backbone or it constitutes one of the end groups of the polymer, Ar can be divalent or monovalent. In certain embodiments, each Ar can be independently a 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a $C_{1-6}$ alkyl group, a $C_{1-6}$ alkoxy group, a $C_{1-6}$ haloalkyl group, $NH_2$, $NH(C_{1-6}$ alkyl) and $N(C_{1-6}$ alkyl)$_2$. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-6}$ alkyl group, a $C_{1-6}$ alkoxy group, a $C_{1-6}$ haloalkyl group, $NH_2$, $NH(C_{1-6}$ alkyl) and $N(C_{1-6}$ alkyl)$_2$. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-6}$ alkyl groups.

By way of example, $(Ar)_m$, $(Ar)_{m'}$, and $(Ar)_{m''}$ can be selected from:

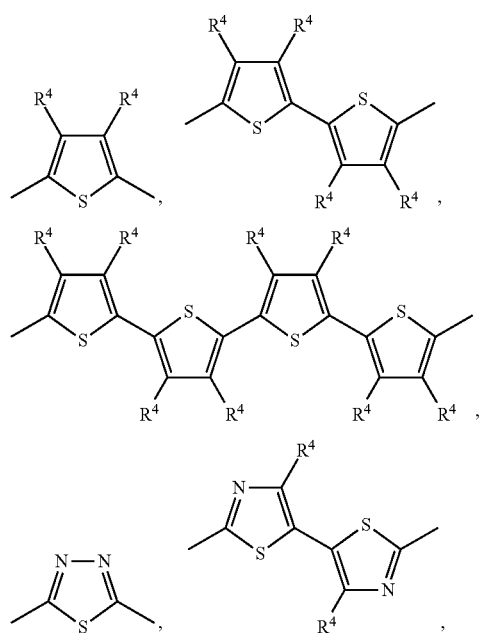

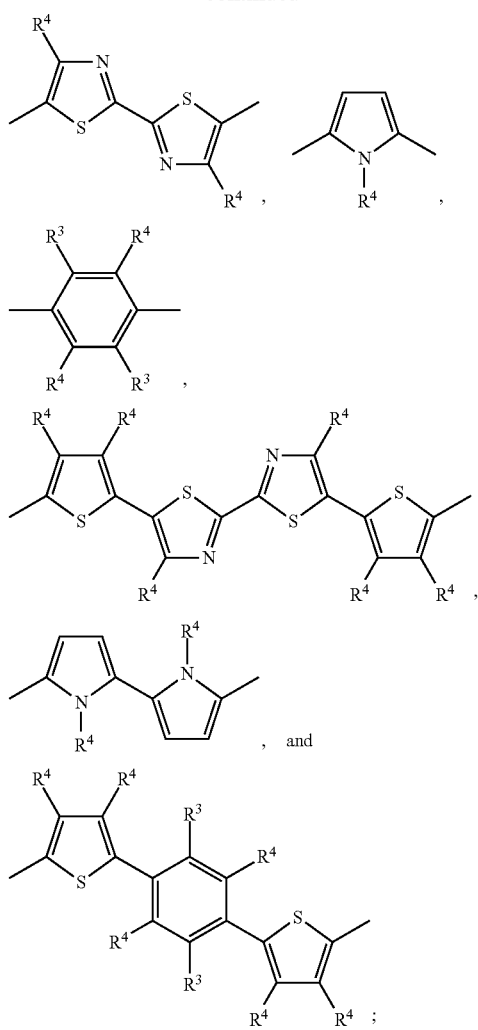

wherein $R^4$, at each occurrence, independently is H or $R^3$, and $R^3$ is as defined herein. In particular embodiments,

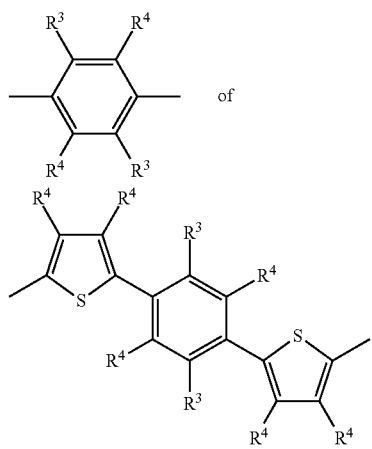

can be selected from:

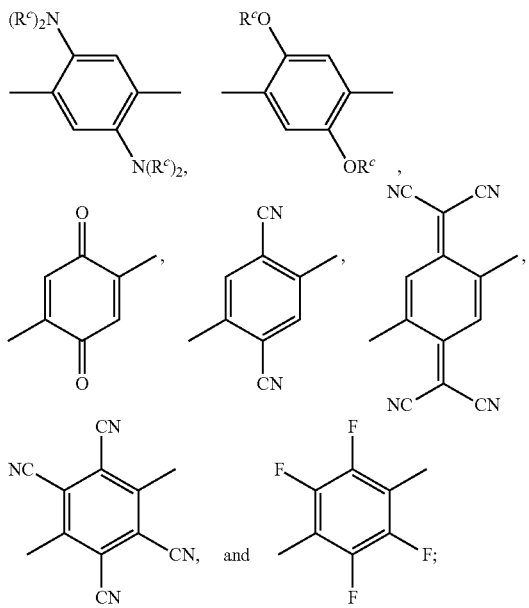

wherein $R^c$ is as defined herein.

In various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

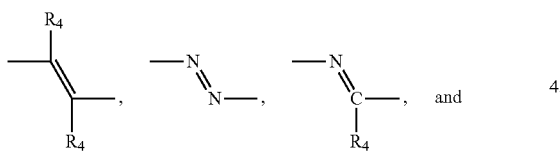

wherein $R^4$ is as defined herein. In certain embodiments, Z can be selected from:

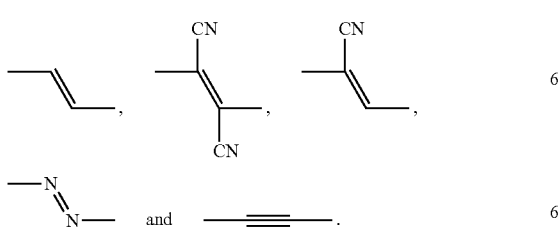

In certain embodiments, $M_2$ can have the formula:

$$-(Ar)_{m''}-,$$

wherein m" is selected from 1, 2, 4, or 6; and Ar is as defined herein. For example, $M_2$ can be selected from:

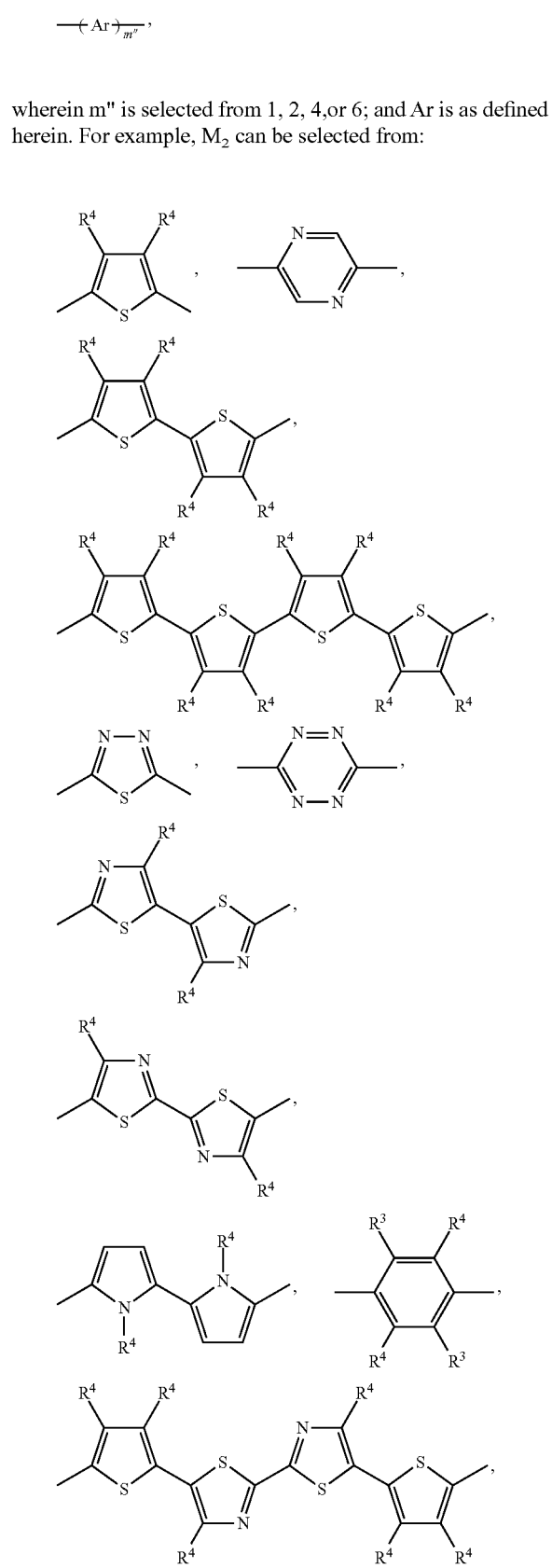

-continued

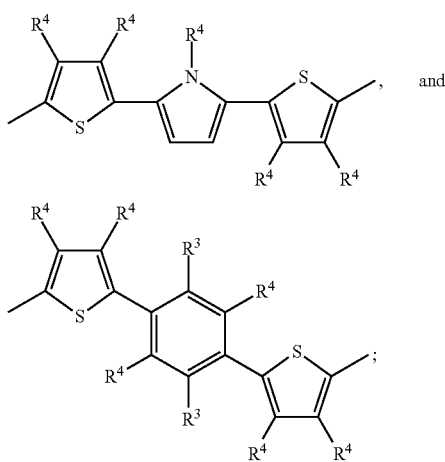

wherein R³ and R⁴ are as defined herein. In particular embodiments, M₂ can be selected from:

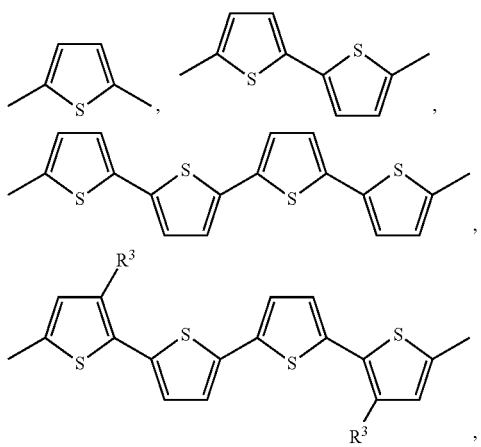

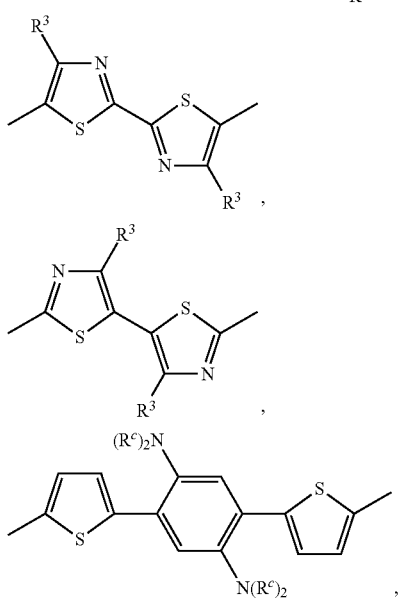

-continued

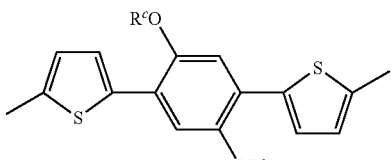

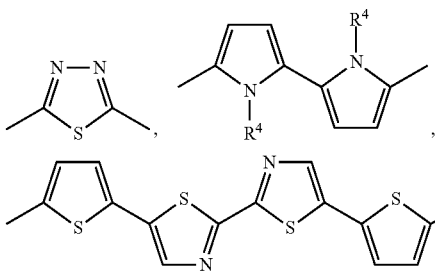

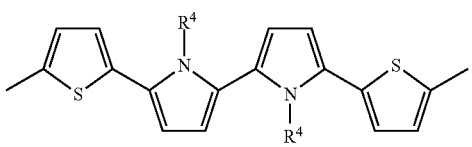

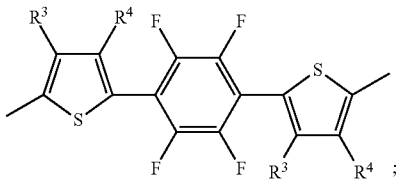

wherein $R^3$ can be independently selected from a halogen, —CN, a $C_{1-20}$ alkyl group, a $C_{1-20}$ alkoxy group, and a $C_{1-20}$ haloalkyl group; $R^4$ can be independently selected from H, a halogen, —CN, a $C_{1-20}$ alkyl group, a $C_{1-20}$ alkoxy group, and a $C_{1-20}$ haloalkyl group; and $R^c$, at each occurrence, can be independently H or a $C_{1-6}$ alkyl group.

In other embodiments, M₂ can have the formula:

$$-(Ar)_{\overline{m}}-Z-(Ar)_{\overline{m'}} \quad \text{or} \quad -Z-(Ar)_{\overline{m''}}-Z-,$$

wherein m and m' are selected from 1, 2, 4, or 6; m" is selected from 1, 2, 3, or 4; and Ar and Z are as defined herein. In some embodiments, M₂ can be selected from:

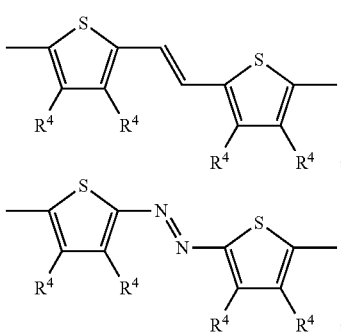

-continued

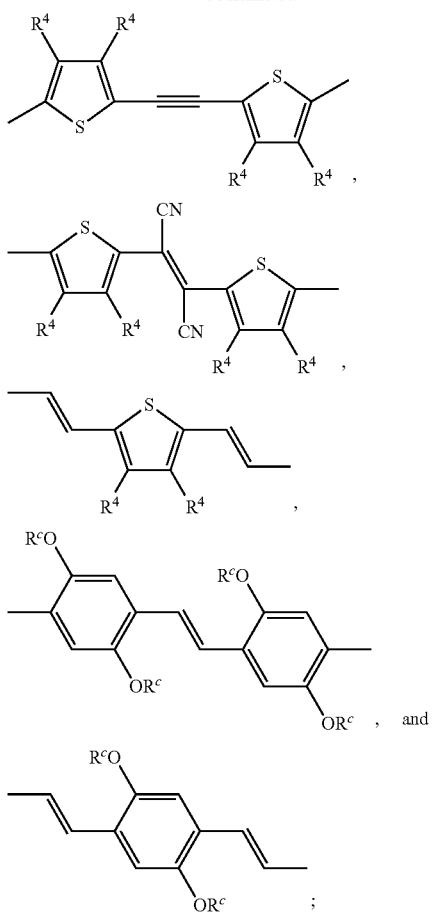

wherein $R^4$ and $R^c$ are as defined herein.

In other embodiments, $M_2$ can have the formula:

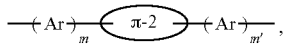

wherein Ar, π-2, m and m' are as defined herein. In some embodiments, both m and m' can be zero. In other words, $M_2$ can have the formula:

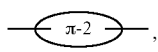

wherein π-2 is as defined herein. For example, π-2 can be an optionally substituted polycyclic moiety including one or more thienyl or phenyl groups such as:

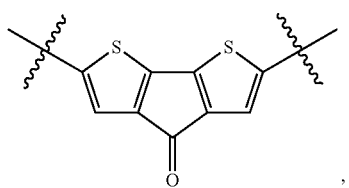

-continued

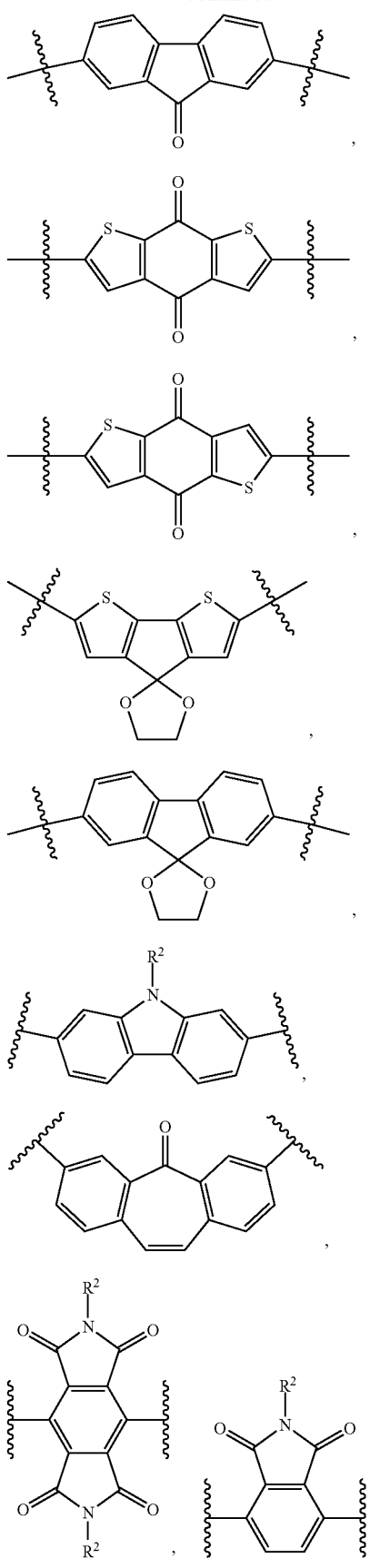

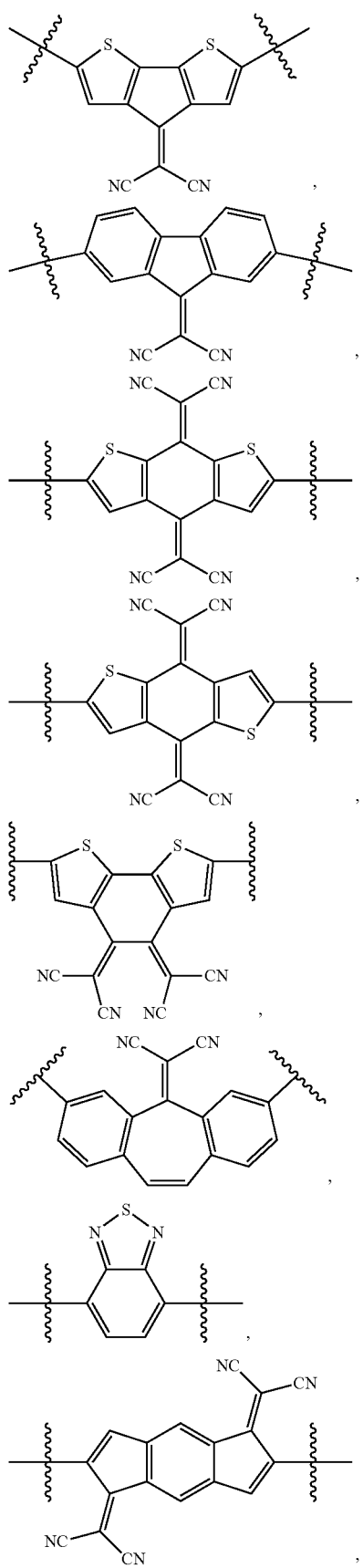
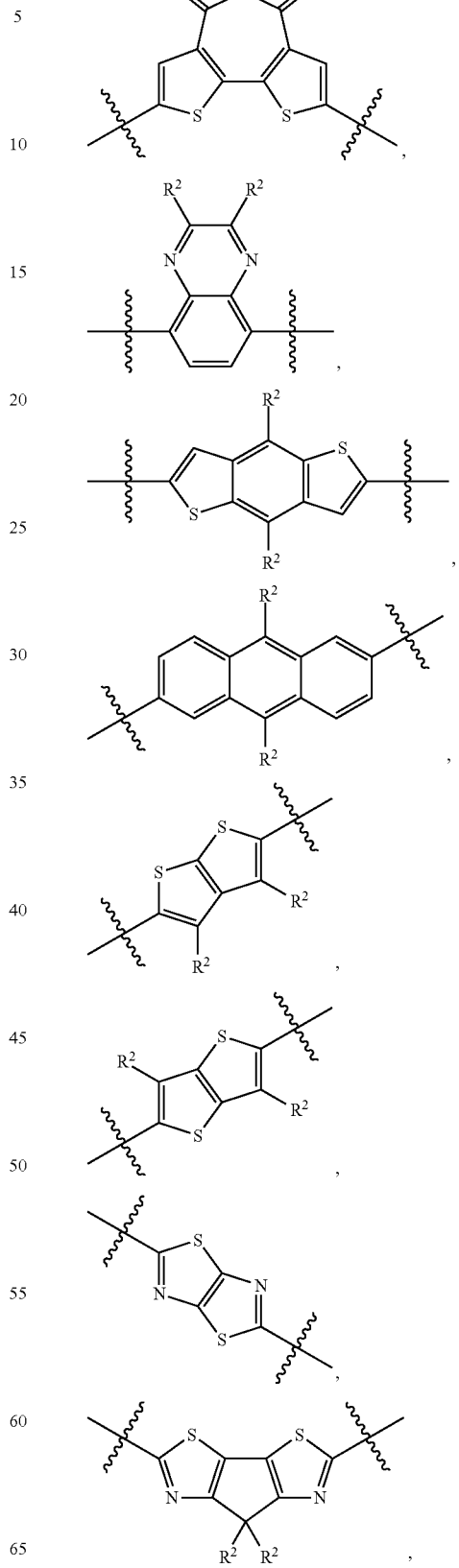

-continued
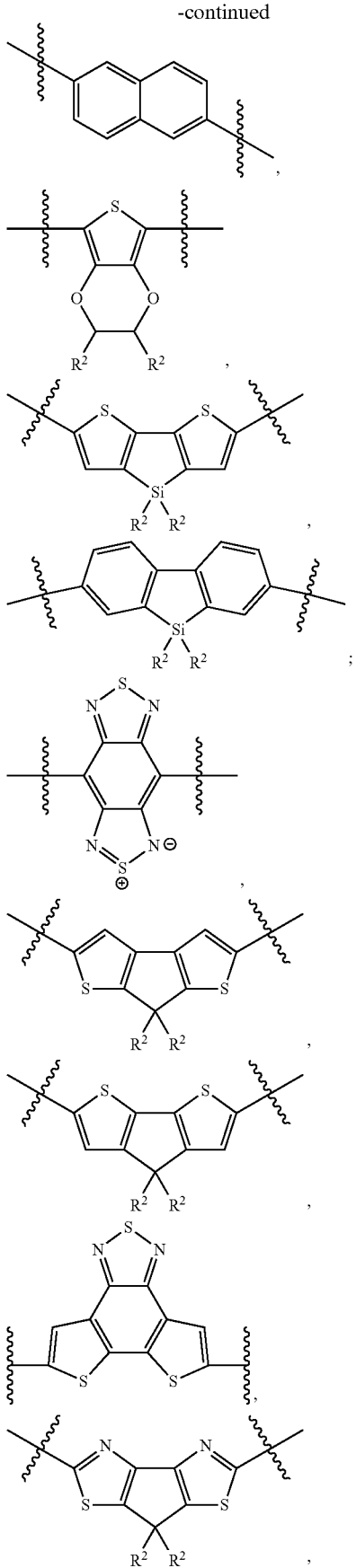
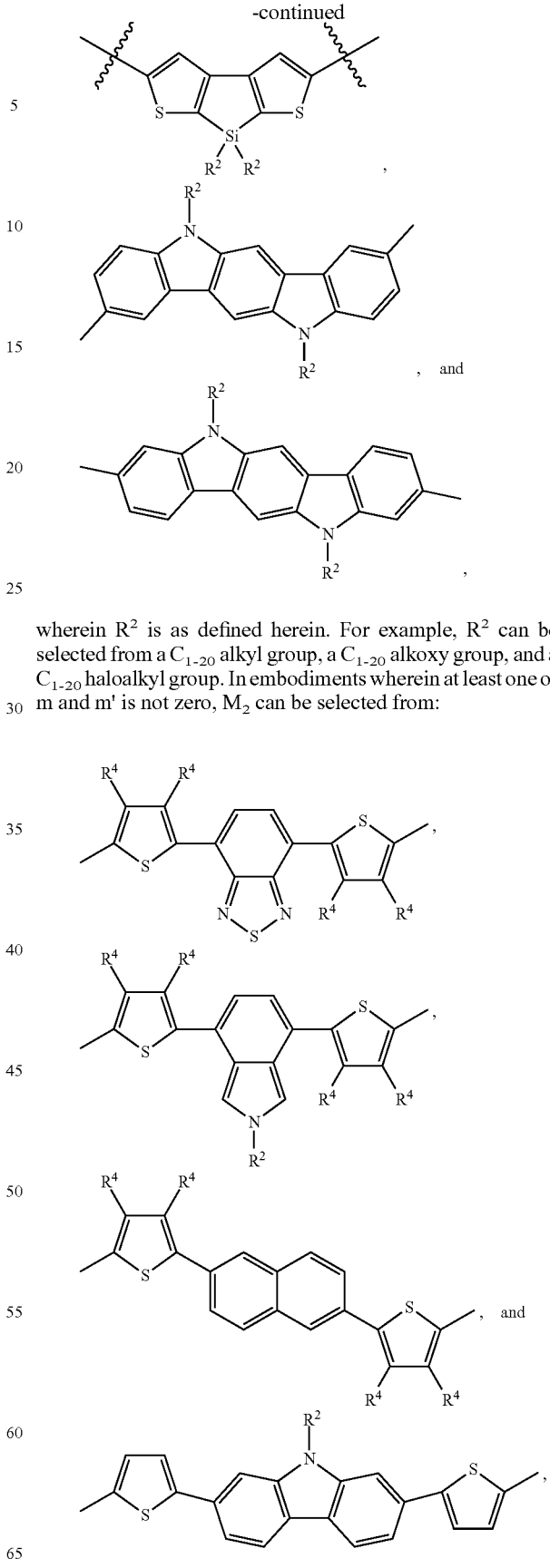
wherein $R^2$ is as defined herein. For example, $R^2$ can be selected from a $C_{1-20}$ alkyl group, a $C_{1-20}$ alkoxy group, and a $C_{1-20}$ haloalkyl group. In embodiments wherein at least one of m and m' is not zero, $M_2$ can be selected from:
wherein $R^2$ and $R^4$ are as defined herein.

In other embodiments, $M_2$ can have a formula selected from:

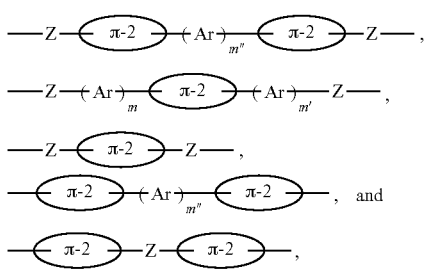

wherein m, m' and m" independently are 1, 2, 3 or 4; and Ar, π-2 and Z are as defined herein. In some embodiments, $M_2$ can be selected from

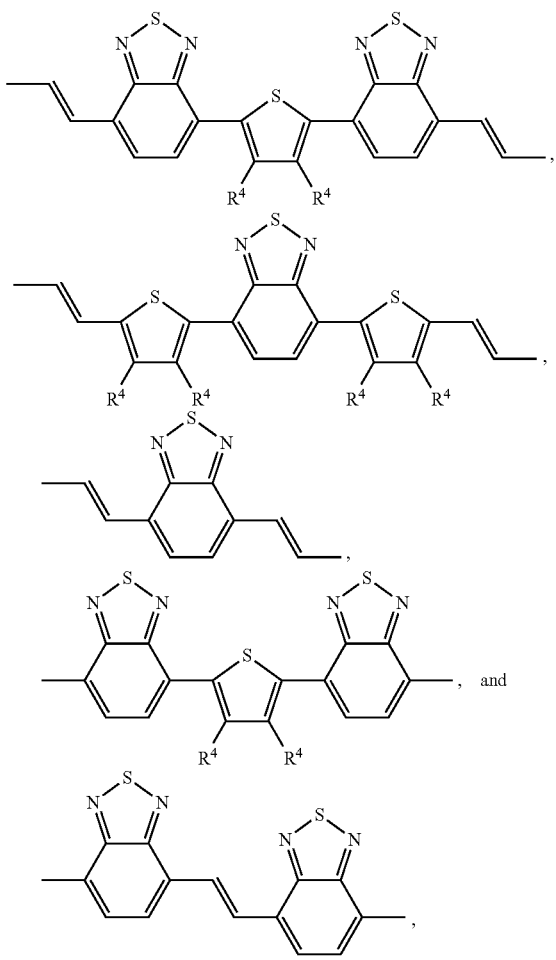

wherein $R^4$ is as defined herein.

For the various polymers described above, n can be an integer between 3 and 1,000. In some embodiments, n can be 4-1,000, 5-1,000, 6-1,000, 7-1,000, 8-1,000, 9-1,000, or 10-1,000. For example, n can be 8-500, 8-400, 8-300, or 8-200. In certain embodiments, n can be 8-100.

While the present teachings generally relate to copolymers of $M_1$ and $M_2$, homopolymers of $M_1$ are within the scope of the present teachings. Further, it should be understood that the present teachings can exclude certain embodiments within the genus of the polymers of the formula described above. For example, the present teachings can exclude polymers where $M_1$ is selected from perylene tetracarboxylic acid diimide, perylene dicarboxylic acid imide, naphthalene tetracarboxylic acid diimide, and naphthalene dicarboxylic acid imide, where each of these groups can be unsubstituted or optionally substituted with particular substituent(s) including those disclosed herein.

Monomers according to the present teachings can be prepared using synthetic routes described in the examples hereinbelow. Other monomers according to the present teachings can be commercially available, known in the literature, or can be prepared from readily prepared intermediates by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. For example, synthesis of alkyldicarboxyimide group can be achieved by reacting an anhydride analog of $M_1$ with an appropriate primary alkylamine ($R^1$—$NH_2$).

The homopolymerization of $M_1$ and the copolymerization of $M_1$ and $M_2$ can be achieved via various reactions known to those skilled in the art, including procedures analogous to those described in Yamamoto, *J. Organomet. Chem.*, 653: 195-199 (2002); Walton et al., *Polymer Chemistry* (Fred J. Davis ed. 2004), p. 158-187; and Galbrecht et al., *Macromolecular Rapid Communications*, 28(4): 387-394 (2007). Scheme 1 below outlines several exemplary reactions that can be used to polymerize $M_1$ by itself or copolymerize $M_1$ with $M_2$.

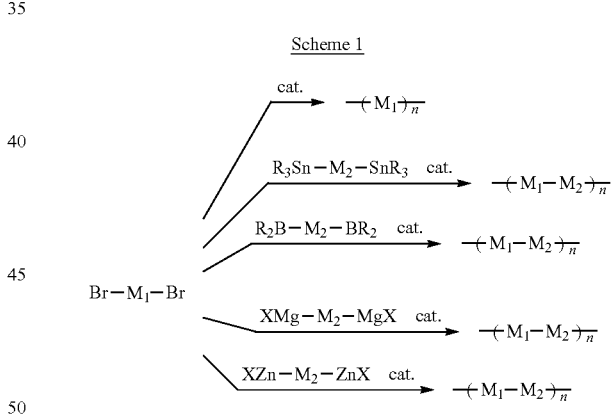

Scheme 1

Without wishing to be bound by any particular theory, it is believed that polymers of the present teachings that have a regioregular polymeric backbone can lead to higher molecular weights, a more π-conjugated structure and, consequently better charge transport efficiencies. Accordingly, in preparing the present polymers, the present teachings can include isolating a particular average molecular weight fractions, and/or enriching and/or isolating a particular stereoisomer of $M_1$ and/or $M_2$ that has two or more stereoisomers.

Certain embodiments disclosed herein can be stable in ambient conditions ("ambient stable") and soluble in common solvents. As used herein, a polymer can be considered electrically "ambient stable" or "stable at ambient conditions" when the carrier mobility or the reduction-potential of the polymer is maintained at about its initial measurement when the polymer is exposed to ambient conditions, for example, air, ambient temperature, and humidity, over a period of time. For example, a polymer according to the present teachings can be described as ambient stable if its carrier mobility or redox potential does not vary more than 20% or more than 10% from its initial value after exposure to ambient conditions, including, air, humidity and temperature, over a 3 day, 5 day, or 10 day period. In addition, a polymer can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

Without wishing to be bound by any particular theory, it is believed that if n-channel transport is desired, the strong electron-depleted electronic structure enabled by $M_1$ copolymerized with a strong electron-depleted $M_2$ repeating unit, together with the regioregular highly π-conjugated polymeric backbone of the present polymers, can make the present polymers ambient-stable n-channel semiconductor materials without requiring additional π-core functionalization (i.e., core substitution of the naphthalene moiety) with strong electron-withdrawing functionalities. If large light absorption (extinction coefficient) is desired, the present polymers can be provided with a highly π-conjugated polymeric backbone and by having the $M_1$ unit copolymerized with an electron-donating $M_2$ comonomer to enable a push-pull structure. If an ambipolar polymer is desired, for example in light-emitting transistor applications, the present polymers can have a highly π-conjugated polymeric backbone comprising a copolymer of $M_1$ and an electron-neutral or electron-donating (electron-rich) $M_2$ unit.

OTFTs based on the present polymers can have long-term operability and continued high-performance in ambient conditions. For example, OTFTs based on certain embodiments of the present polymers can maintain satisfactory device performance in highly humid environment. Certain embodiments of the present polymers also can exhibit excellent thermal stability over a wide range of annealing temperatures. Photovoltaic devices can maintain satisfactory power conversion efficiencies over an extended period of time.

As used herein, a polymer can be considered soluble in a solvent when at least 0.1 mg of the polymer can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone. The present polymers can have room temperature solubilities in conventional organic solvents such as xylene, dichlorobenzene (DCB), and other chlorinated hydrocarbons (CHCs) as high as 60 g/L.

The present polymers can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Polymers of the present teachings can be used to prepare semiconductor materials (e.g., compositions and composites), which in turn can be used to fabricate various articles of manufacture, structures, and devices. In some embodiments, semiconductor materials incorporating one or more polymers of the present teachings can exhibit n-type semiconductor activity, ambipolar activity, light absorption, and light emission.

The present teachings, therefore, further provide methods of preparing a semiconductor material. The methods can include preparing a composition that includes one or more polymers disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a polymer disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the polymers disclosed herein are within the scope of the present teachings as are methods of making the same. The present polymers can offer processing and operation advantages in the fabrication and/or the use of these devices. For example, articles of manufacture such as the various devices described herein can include a composite having a semiconductor material of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., described in Yoon, M-H. et al., *PNAS*, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Other articles of manufacture in which polymers of the present teachings are useful are photovoltaics or solar cells. Polymers of the present teachings can exhibit broad optical absorption and/or a tuned redox properties and bulk carrier mobilities, making them desirable for such applications. Accordingly, the polymers described herein can be used as an acceptor (n-type) semiconductor or a donor (p-type) semiconductor depending on the nature of the $M_2$ unit in a photovoltaic design, which includes an adjacent p-type or n-type semiconductor material, respectively, that forms a p-n junction. The polymers can be in the form of a thin film semiconductor, which can be deposited on a substrate to form a composite. Exploitation of polymers of the present teachings in such devices is within the knowledge of a skilled artisan.

Accordingly, another aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures. FIG. 1 illustrates the four common types of OFET structures: (a) bottom-gate top-contact structure 1*a*, (b) bottom-gate bottom-contact structure 1*b*, (c) top-gate bottom-contact structure 1*c*, and (d) top-gate top-contact structure 1*d*. As shown in FIG. 1, an OFET can include a dielectric layer (e.g., shown as 8, 8', 8", and 8'" in FIGS. 1*a*, 1*b*, 1*c*, and 1*d*, respectively), a semiconductor/channel layer (e.g., shown as 6, 6', 6", and 6'" in FIGS. 1*a*, 1*b*, 1*c*, and 1*d*, respectively), a gate contact (e.g., shown as 10, 10', 10", and 10'" in FIGS. 1*a*, 1*b*, 1*c*, and 1*d*, respectively), a substrate (e.g., shown as 12, 12', 12", and 12'" in FIGS. 1*a*, 1*b*, 1*c*, and 1*d*, respectively), and source and drain contacts (e.g., shown as 2, 2', 2", 2'", 4, 4', 4", and 4'" in FIGS. 1*a*, 1*b*, 1*c*, and 1*d*, respectively).

In certain embodiments, OTFT devices can be fabricated with the present polymers on doped silicon substrates, using $SiO_2$ as the dielectric, in top-contact geometries. In particular embodiments, the active semiconductor layer which incorporates at least a polymer of the present teachings can be deposited at room temperature or at an elevated temperature. In other embodiments, the active semiconductor layer which incorporates at least one polymer of the present teachings can be applied by spin-coating or printing as described herein. For top-contact devices, metallic contacts can be patterned on top of the films using shadow masks.

In certain embodiments, OTFT devices can be fabricated with the present polymers on plastic foils, using polymers as the dielectric, in top-gate bottom-contact geometries. In particular embodiments, the active semiconducting layer which incorporates at least a polymer of the present teachings can be deposited at room temperature or at an elevated temperature. In other embodiments, the active semiconducting layer which incorporates at least a polymer of the present teachings can be applied by spin-coating or printing as described herein. Gate and source/drain contacts can be made of Au, other metals, or conducting polymers and deposited by vapor-deposition and/or printing.

Figure 2:
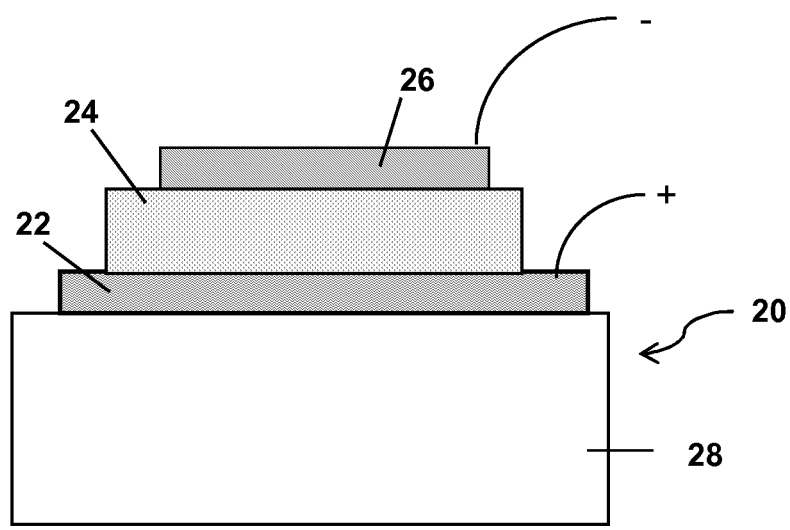
FIG. 2 illustrates a representative structure of a bulk-heterojunction organic photovoltaic device (also known as a solar cell), which can incorporate one or more polymers of the present teachings as the donor and/or acceptor materials.
Figure 3:
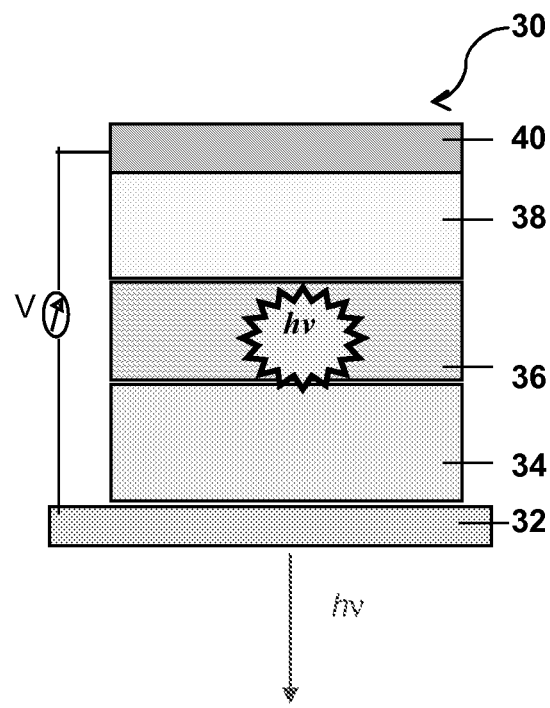
FIG. 3 illustrates a representative structure of an organic light-emitting device which can incorporate one or more polymers of the present teachings as electron-transporting and/or emissive and/or hole-transporting materials.

Similarly, another aspect of the present teachings relates to methods of fabricating an organic light-emitting transistor, an organic light-emitting diode (OLED), or an organic photovoltaic device that incorporates one or more semiconductor materials of the present teachings. FIG. 2 illustrates a representative structure of a bulk-heterojunction organic photovoltaic device (also known as solar cell 20) which can incorporate one or more polymers of the present teachings as the donor and/or acceptor materials. As shown, a representative solar cell generally includes a substrate 28 (e.g., glass), an anode 22 (e.g., ITO), a cathode 26 (e.g., aluminium or calcium), and an active layer 24 between the anode and the cathode which can incorporate one or more polymers of the present teachings as the electron donor (p-channel) and/or electron acceptor (n-channel) materials. FIG. 3 illustrates a representative structure of an OLED which can incorporate one or more polymers of the present teachings as electron-transporting and/or emissive and/or hole-transporting materials. As shown, an OLED 30 generally includes a substrate (not shown), a transparent anode 32 (e.g., ITO), a cathode 40 (e.g., metal), and one or more organic layers which can incorporate one or more polymers of the present teachings as hole-transporting (n-channel) (layer 34 as shown) and/or emissive (layer 36 as shown) and/or electron-transporting (p-channel) materials (layer 38 as shown).

The following examples, which describe the preparation of certain embodiments of comonomer $M_1$ of the present teachings, are provided to illustrate further and to facilitate the understanding of the present teachings and are not in any way intended to limit the invention.

It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

EXAMPLE 1
Proposed synthesis of N,,N'-bis(R)-2,7-dibromonaphtho[2,3-b:6,7-b']dithiophene-4,5,9,10-tetra-carboxylic diimide
a) Synthesis 1:
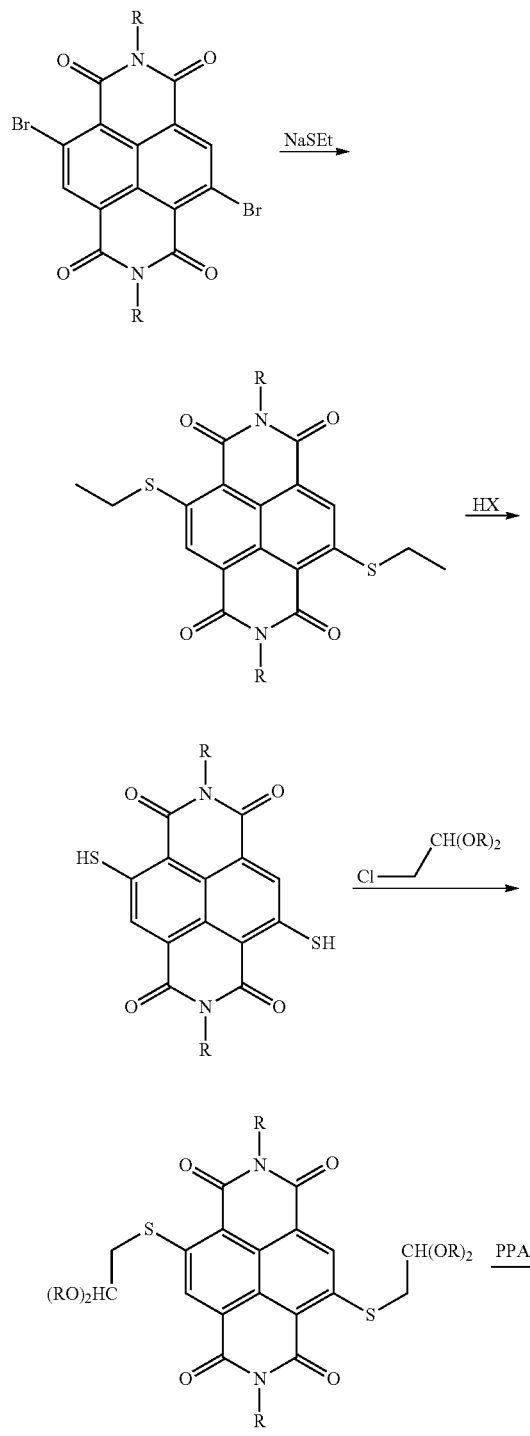
b) Synthesis 2:
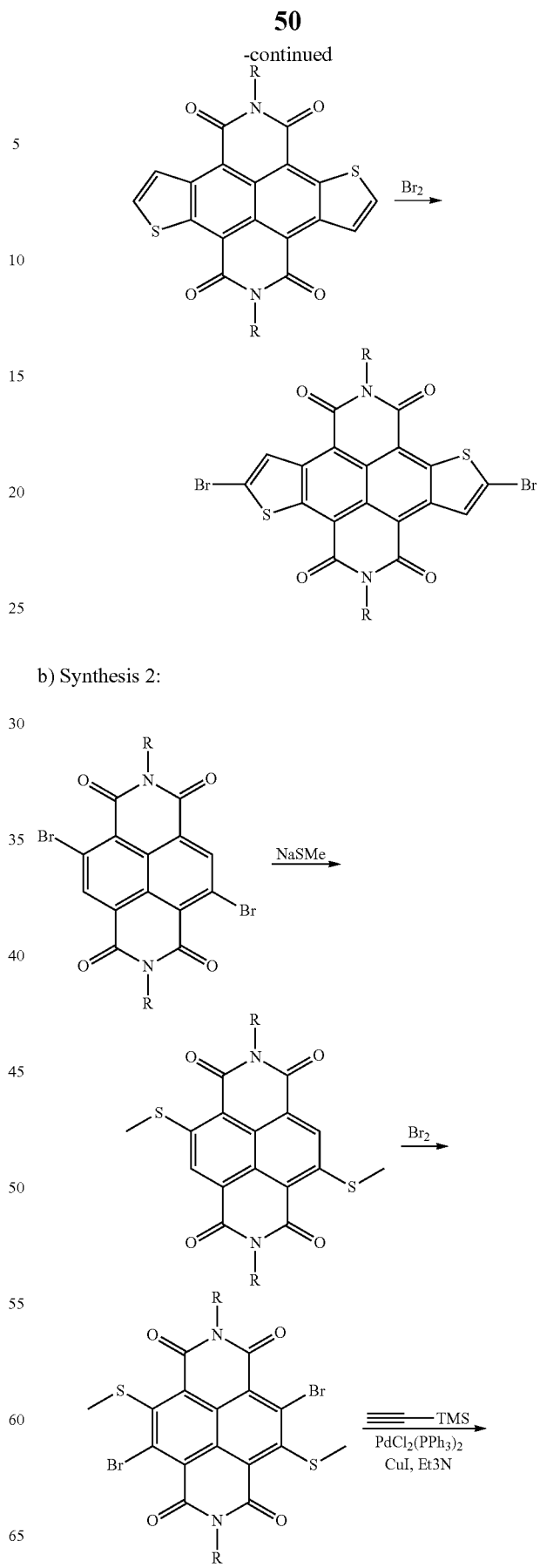

EXAMPLE 2
Proposed synthesis of N,N'-bis(R)-2,7-dibromonaph-tho[2,3-b:6,7-d]dithiozole-4,5,9,10-tetracarboxylic diimide
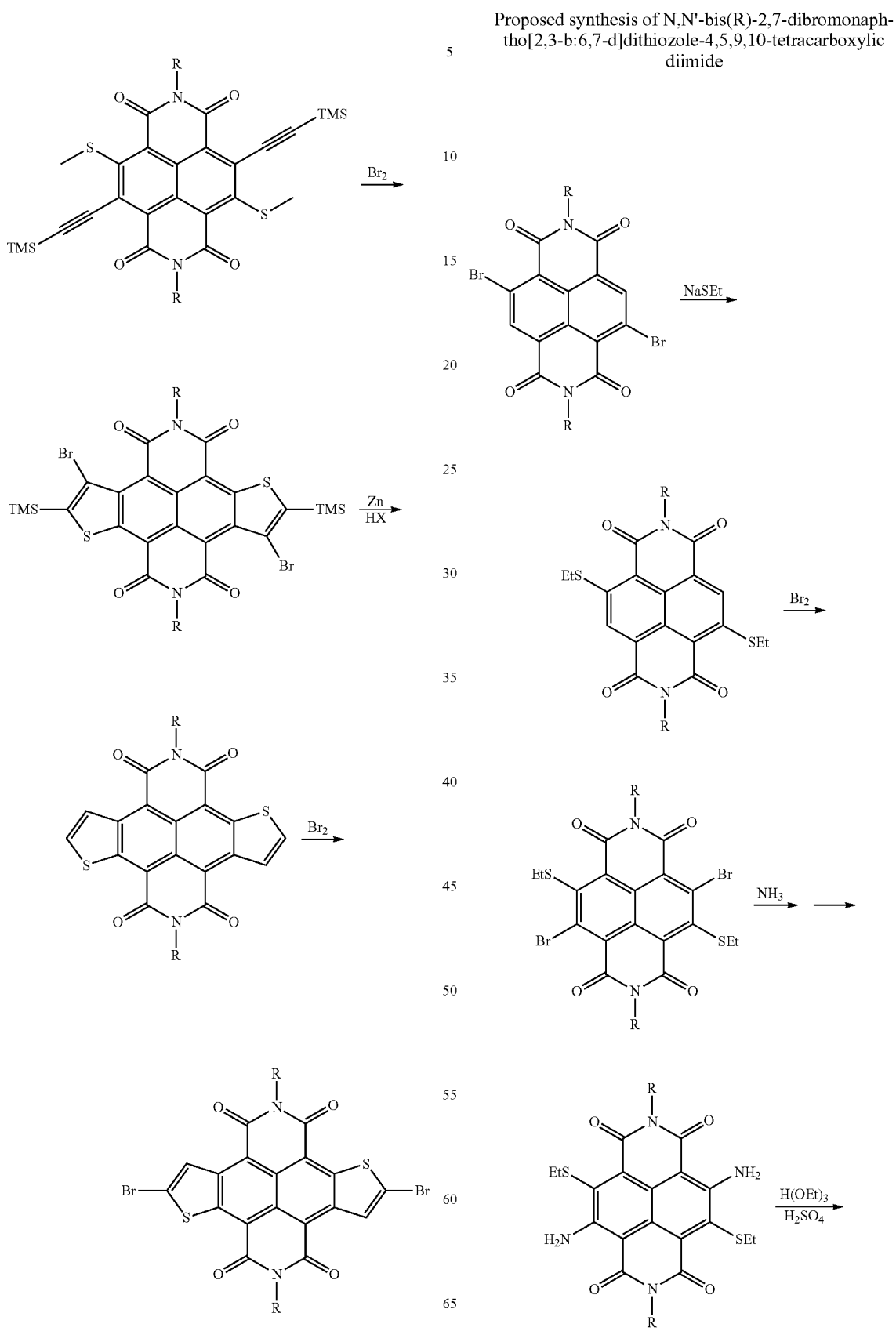

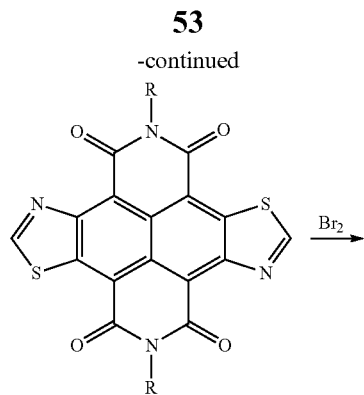
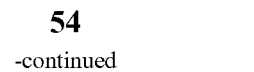
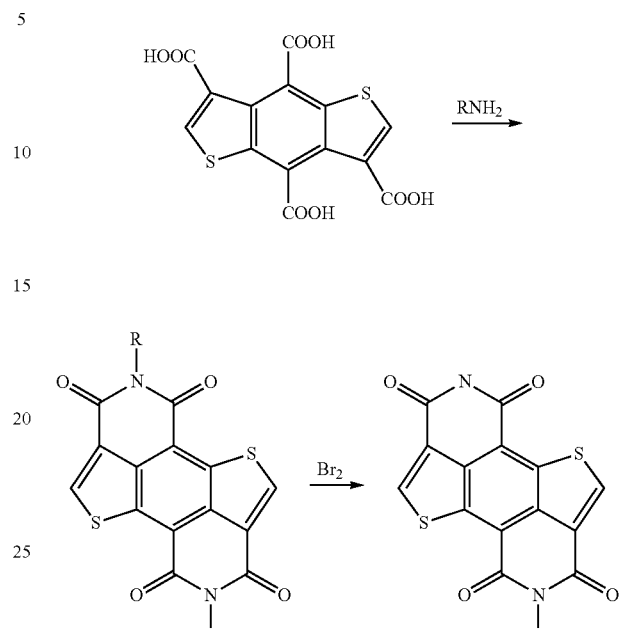
EXAMPLE 3
Proposed synthesis of N,N'-bis(R)-2,6-dibromobenzo[1,2-b:4,5-b']dithiophene-3,4,7,8-tetracarboxylic diimide
EXAMPLE 4
Proposed Synthesis of Naphthalene Tetracarboxylic Diimide Derivative
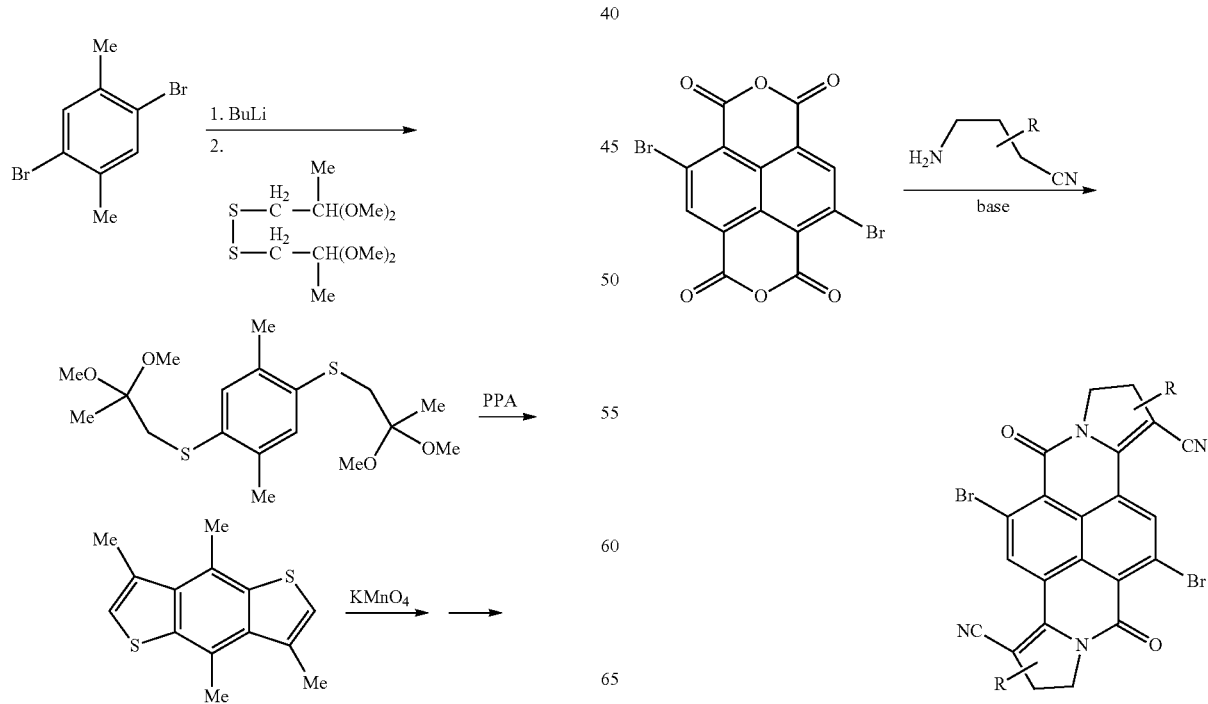

EXAMPLE 5
Proposed Synthesis of Naphthalene Tetracarboxylic Diimide Derivative
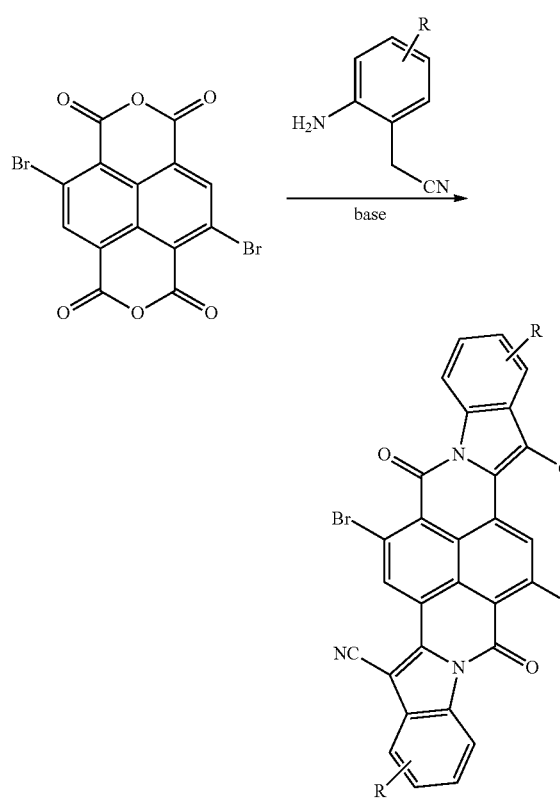
EXAMPLE 6
Proposed synthesis of 1,5-di(R)-indolo[5,4,3-cde]indole-2,6-dione
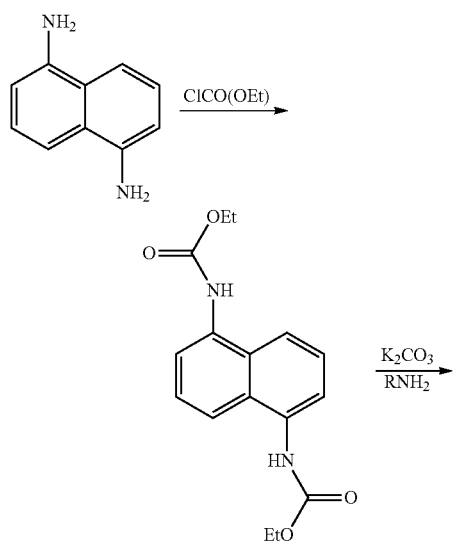
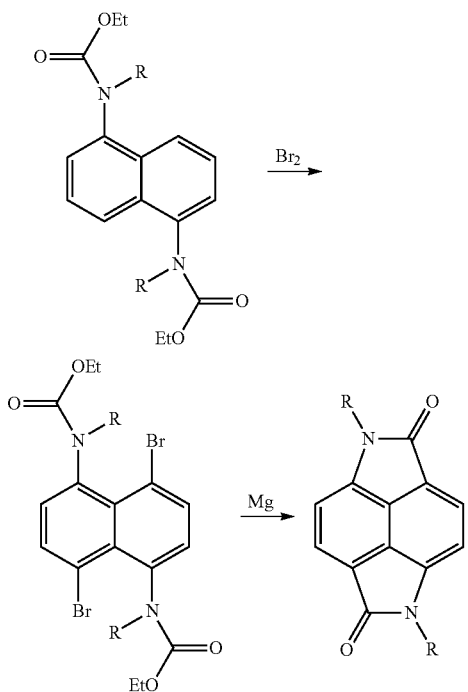
EXAMPLE 7
Proposed Synthesis of Diazanaphthalene Monomer
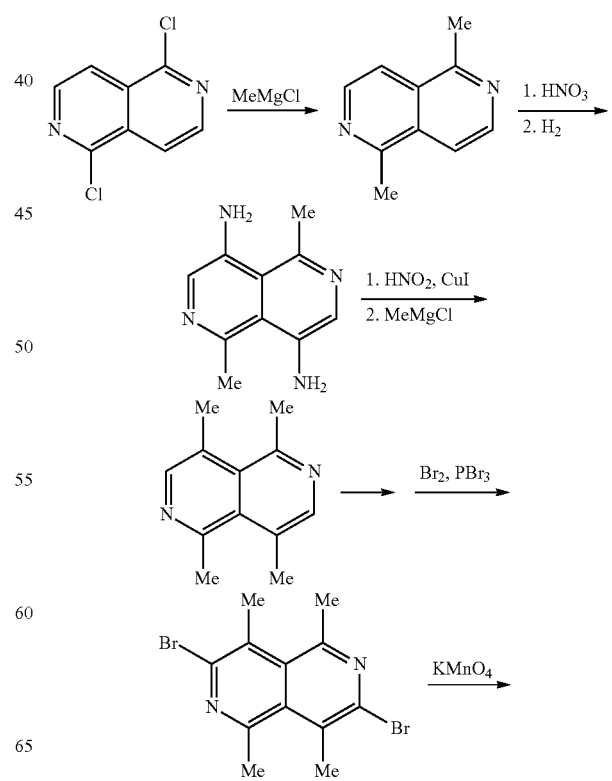

-continued

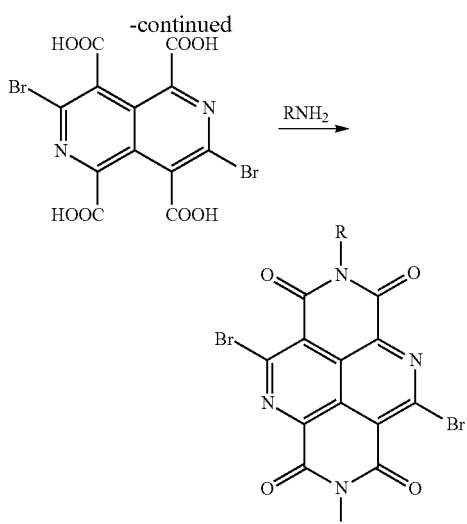

EXAMPLE 8

Proposed Synthesis of Pyrrolylpyrrole Monomer

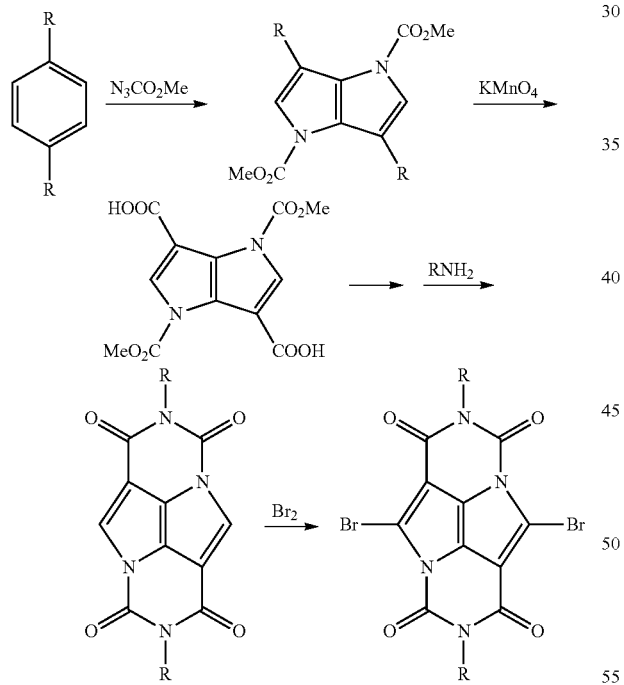

The following references describe synthetic routes, reactants, intermediates, solvents, catalysts, and reaction conditions that can be used to prepare monomers and polymers according to the present teachings:

Advances in Heterocyclic Chemistry [In: Adv. Heterocycl. Chem., Alan R. Katritzky (ed.), Elsevier Inc., San Diego, Calif. (2008)], p. 267;

Horton et al., "The combinatorial synthesis of bicyclic privileged structures or privileged substructures," Chemical Reviews, 103(3): 893-930 (2003);

Pradhan et al., "Synthesis of polynuclear aromatic compounds incorporating a fused thiophene ring," Heterocycles, 65(6): 1491-1513 (2005);

Abass, "Fused quinolines. Recent synthetic approaches to azoloquinolines. A review," Heterocycles, 65(4): 901-965 (2005);

Satake et al., "Organic thermal reactions. 55.Chemical behavior and properties of tetrahydropyrrolo[3,2-b]pyrrole," Chemistry Letters, 5: 743-6 (1983);

Yoshida et al., "Synthesis of Benzo[b]thiophenes by Cyclization of Arylketene Dithioacetal Monoxides under Pummerer-like Conditions," Organic Letters, 9(26): 5573-5576 (2007);

Mase et al., "General and practical synthesis of benzothiazoles," Pure and Applied Chemistry, 80(4): 707-715 (2008); and Kelarev et al., "Synthesis and properties of azoles containing benzothiazole substituents. (Review)," Chemistry of Heterocyclic Compounds (New York, N.Y.; Translation of Khimiya Geterotsiklicheskikh Soedinenii); 39(10): 1267-1306 (2003).

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A homopolymer or copolymer comprising a repeating unit $M_1$ selected from:

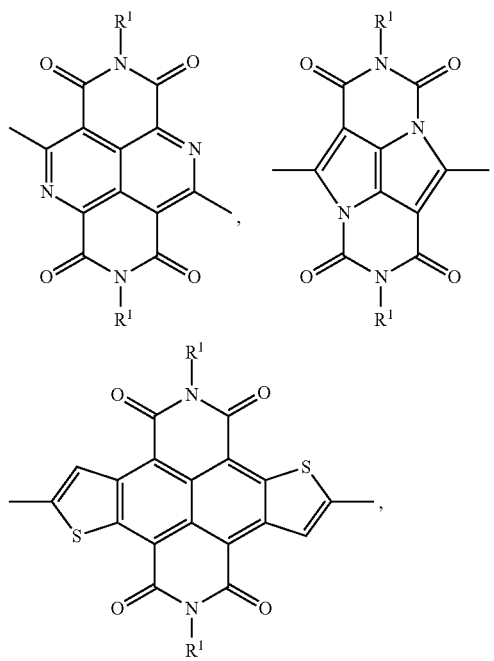

-continued

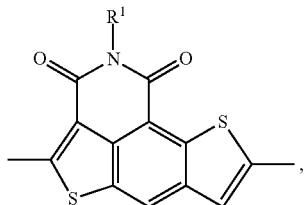

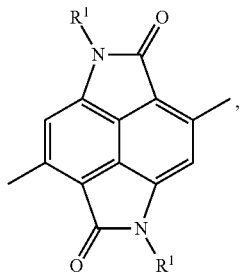

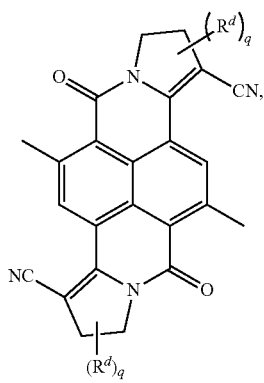

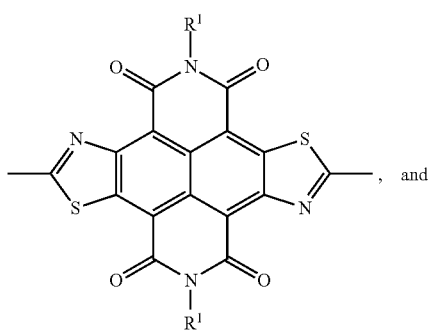

-continued

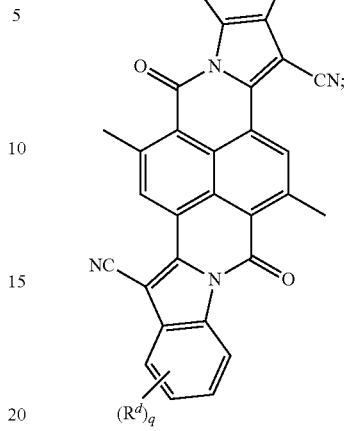

wherein:
R$^1$, at each occurrence, is independently selected from H, a C$_{1-40}$ alkyl group, a C$_{2-40}$ alkenyl group, a C$_{2-40}$ alkynyl group, a C$_{1-40}$ haloalkyl group, -L-R$^a$, -L-Ar$^1$, -L-Ar$^1$—Ar$^1$, -L-Ar$^1$—R$^a$, -L-Ar$^1$—Ar$^1$—R$^a$, -L-Cy$^1$, -L-Cy$^1$-Cy$^1$, -L-Cy$^1$-R$^a$, and -L-Cy$^1$-Cy$^1$-R$^a$;

wherein:
L, at each occurrence, is independently selected from —O—, —Y—O—Y—, —S—, —S(O)—, —Y—S—Y—, —C(O)—, —NR$^c$C(O)—, —C(O)NR$^c$—, —NR$^c$—, —SiR$^c$$_2$—, —Y—[SiR$^c$$_2$]—Y—, a divalent C$_{1-20}$ alkyl group, a divalent C$_{1-20}$ alkenyl group, a divalent C$_{1-20}$ haloalkyl group, and a covalent bond;

Ar$^1$, at each occurrence, is independently a C$_{6-14}$ aryl group or a 5-14 membered heteroaryl group, each optionally substituted with 1-5 substituents independently selected from a halogen, —CN, oxo, =C(CN)$_2$, a C$_{1-6}$ alkyl group, a C$_{1-6}$ alkoxy group, and a C$_{1-6}$ haloalkyl group;

Cy$^1$, at each occurrence, is independently a C$_{3-14}$ cycloalkyl group or a 3-14 membered cycloheteroalkyl group, each optionally substituted with 1-5 substituents independently selected from a halogen, —CN, oxo, =C(CN)$_2$, a C$_{1-6}$ alkyl group, a C$_{1-6}$ alkoxy group, and a C$_{1-6}$ haloalkyl group; and R$^a$, at each occurrence, is independently selected from a C$_{1-40}$ alkyl group, a C$_{2-40}$ alkenyl group, a C$_{2-40}$ alkynyl group, a C$_{1-40}$ haloalkyl group, a C$_{1-40}$ alkoxy group, -L'-R$^b$, -L'-Ar$^2$, -L'-Ar$^2$—Ar$^2$, -L'-AR$^2$—R$^b$, -L'-Ar$^2$—Ar$^2$—R$^b$, -L'-Cy$^2$, -L'-Cy$^2$-Cy$^2$, -L'-Cy$^2$-R$^b$, -L'-Cy$^2$-Cy$^2$-R$^b$;

wherein:
L', at each occurrence, is independently selected from —O—, —Y—O—Y—, —S—, —S(O)—, —Y—S—Y—, —C(O)—, —NR$^c$C(O)—, —C(O)NR$^c$—, —NR$^c$—, —SiR$^c$$_2$—, —Y—[SiR$^c$$_2$]—Y—, a divalent C$_{1-20}$ alkyl group, a divalent C$_{1-20}$ alkenyl group, a divalent C$_{1-20}$ haloalkyl group, and a covalent bond;

Ar$^2$, at each occurrence, is independently a C$_{6-14}$ aryl group or a 5-14 membered heteroaryl group, each optionally substituted with 1-5 substituents independently selected from halogen, —CN, oxo, =C(CN)$_2$, a C$_{1-6}$ alkyl group, a C$_{1-6}$ alkoxy group, and a C$_{1-6}$ haloalkyl group;

Cy$^2$, at each occurrence, is independently a C$_{3-14}$ cycloalkyl group or a 3-14 membered cycloheteroalkyl group, each optionally substituted with 1-5 substituents independently selected from a halogen, —CN, oxo, =C(CN)$_2$, a C$_{1-6}$ alkyl group, a C$_{1-6}$ alkoxy group, and a C$_{1-6}$ haloalkyl group;

R$^b$, at each occurrence, is independently selected from a C$_{1-40}$ alkyl group, a C$_{2-40}$ alkenyl group, a C$_{2-40}$ alkynyl group, a C$_{1-40}$ haloalkyl group, and a C$_{1-40}$ group;

R$^c$, at each occurrence, is independently selected from H, a C$_{1-6}$ alkyl group, and a —Y—C$_{6-14}$ aryl group; and Y, at each occurrence, is independently selected from a divalent C$_{1-6}$ alkyl group, a divalent C$_{1-6}$ haloalkyl group, and a covalent bond;

R$^d$, at each occurrence, is a) halogen, b) —CN, c) —NO$_2$, d) oxo, e) =C(R$^e$)$_2$, f) a C$_{1-40}$ alkyl group, g) a C$_{2-40}$ alkenyl group, h) a C$_{2-40}$ alkynyl group, i) a C$_{1-40}$ haloalkyl group, j) a —Y—C$_{3-10}$ cycloalkyl group, k) a —Y—C$_{6-14}$ aryl group, l) a —Y—C$_{6-14}$ haloaryl group, m) a —Y-3-12 membered cycloheteroalkyl group, or n) a —Y-5-14 membered heteroaryl group, wherein each of the C$_{1-40}$ alkyl group, the C$_{2-40}$ alkenyl group, the C$_{2-40}$ alkynyl group, the C$_{3-10}$ cycloalkyl group, the C$_{6-14}$ aryl group, the C$_{6-14}$ haloaryl group, the 3-12 membered cycloheteroalkyl group, and the 5-14 membered heteroaryl group is optionally substituted with 1-4 R$^e$ groups;

wherein:

R$^e$, at each occurrence, is selected from a) halogen, b) —CN, c) —NO$_2$, d) oxo, e) —OH, f) —O—C$_{1-20}$ alkyl, g) —O—C$_{6-14}$ aryl, h) —NH$_2$, i) —NH(C$_{1-20}$ alkyl), j) —N(C$_{1-20}$ alkyl)$_2$, k) —N(C$_{1-20}$ alkyl)—C$_{6-14}$ aryl, l) —N(C$_{6-14}$ aryl)$_2$, m) —S(O)$_m$H, n) —S(O)$_m$—C$_{1-20}$ alkyl, o) —S(O)$_2$OH, p) —S(O)$_m$—OC$_{1-20}$ alkyl, q) —S(O)$_m$—OC$_{6-14}$ aryl, r) —CHO, s) —C(O)—C$_{1-20}$ alkyl, t) —C(O)—C$_{6-14}$ aryl, u) —C(O)OH, v) —C(O)—OC$_{1-20}$ alkyl, w) —C(O)—OC$_{6-14}$ aryl, x) —C(O)NH$_2$, y) —C(O)NH—C$_{1-20}$ alkyl, z) —C(O)N(C$_{1-20}$ alkyl)$_2$, aa) —C(O)NH—C$_{6-14}$ aryl, ab) —C(O)N(C$_{1-20}$ alkyl)—C$_{6-14}$ aryl, ac) —C(O)N(C$_{6-14}$ aryl)$_2$, ad) —C(S)NH$_2$, ae) —C(S)NH—C$_{1-20}$ alkyl, af) —C(S)N(C$_{1-20}$ alkyl)$_2$, ag) —C(S)N(C$_{6-14}$ aryl)$_2$, ah) —C(S)N(C$_{1-20}$ alkyl)—C$_{6-14}$ aryl, ai) —C(S)NH—C$_{6-14}$ aryl, aj) —S(O)$_m$NH$_2$, ak) —S(O)$_m$NH(C$_{1-20}$ alkyl), al) —S(O)$_m$N(C$_{1-20}$ alkyl)$_2$, am) —S(O)$_m$NH(C$_{6-14}$ aryl), an) —S(O)$_m$N(C$_{1-20}$ alkyl)—C$_{6-14}$ aryl, ao) —S(O)$_m$N(C$_{6-14}$ aryl)$_2$, ap) —SiH$_3$, aq) —SiH(C$_{1-20}$ alkyl)$_2$, ar) —SiH$_2$(C$_{1-20}$ alkyl), as) —Si(C$_{1-20}$ alkyl)$_3$, at) a C$_{1-20}$ alkyl group, au) a C$_{2-20}$ alkenyl group, av) a C$_{2-20}$ alkynyl group, aw) a C$_{1-20}$ alkylthio group, ax) a C$_{1-20}$ haloalkyl group, ay) a C$_{3-10}$ cycloalkyl group, az) a C$_{6-14}$ aryl group, ba) a C$_{6-14}$ haloaryl group, bb) a 3-12 membered cycloheteroalkyl group, and bc) a 5-14 membered heteroaryl group; and q is 0, 1, 2 or 3;

wherein the homopolymer or copolymer has a degree of polymerization (n) that is greater than 2.

2. A copolymer according to claim 1 having the formula:

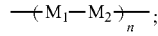

wherein M$_2$ has a formula selected from:

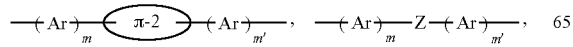

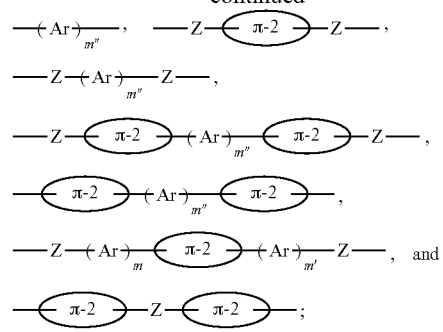

wherein:

π-2 is an optionally substituted fused ring moiety;

Ar, at each occurrence, is independently an optionally substituted 5- or 6-membered aryl or heteroaryl group;

Z is a conjugated linear linker; and m, m' and m" independently are 0, 1, 2, 3, 4, 5 or 6; and M$_1$ and n are as defined in claim 1.

3. The homopolymer or copolymer of claim 1, wherein M$_1$ is

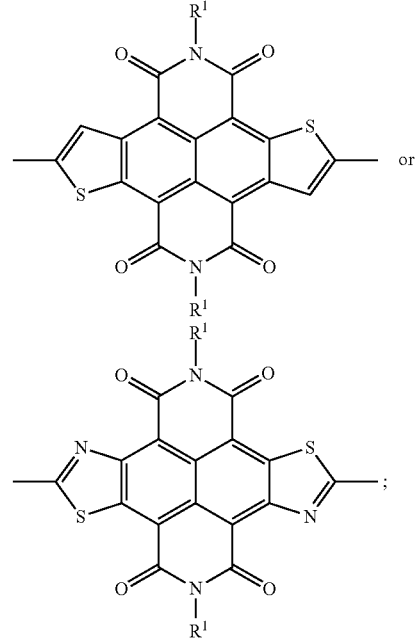

wherein R$_1$ is as defined in claim 1.

4. The hompolymer or copolymer of claim 1, wherein M$_1$ is selected from:

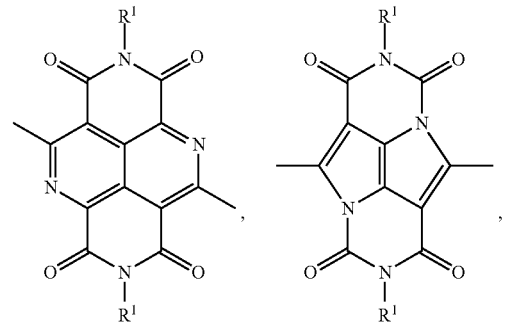

-continued
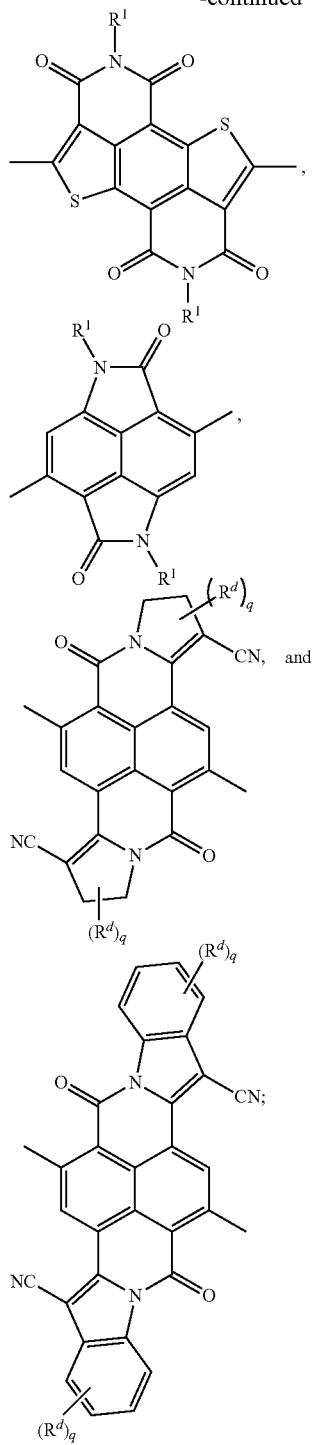
wherein:
R¹, Rᵈ, and q are as defined in claim 1.
5. A copolymer according to claim 2, wherein Z is selected from:
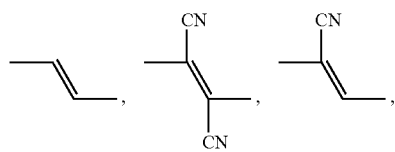
-continued
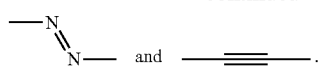
6. A copolymer according to claim 2, wherein π-2 is an optionally substituted $C_{8-22}$ aryl group or 8-22 membered heteroaryl group selected from:
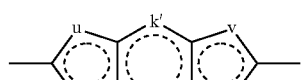
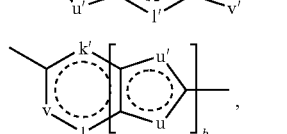
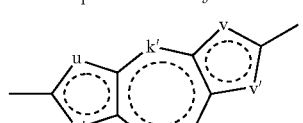
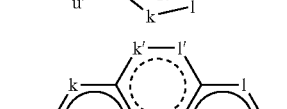
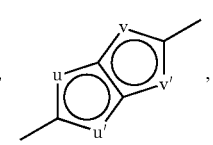
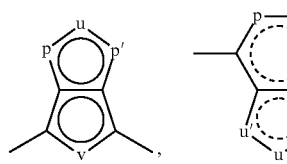
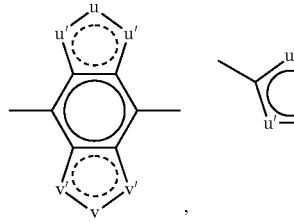
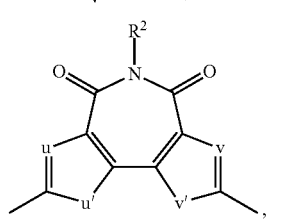

-continued

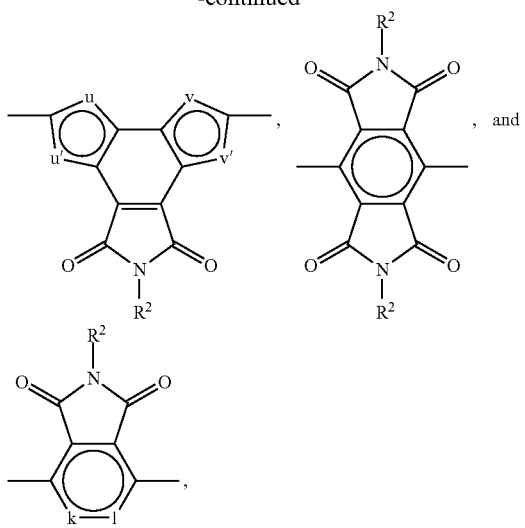

wherein:
k, k', l and l' independently can be selected from —CR²=, =CR²—, —C(O)—, and —C(C(CN)₂)—;
p, p', q and q' independently can be selected from —CR²=, =CR²—, —C(O)—, —C(C(CN)₂)—, —O—, —S—, —N=, =N—, —N(R²)—, —SiR²=, =SiR²—, and —SiR²R²—;
r and s independently can be —CR²R²— or —C(C(CN)₂)—;
u, u', v and v' independently can be selected from —CR²=, =CR²—, —C(O)—, —C(C(CN)₂)—, —S—, —S(O)—, —S(O)₂—, —O—, —N=, =N—, —SiR²=, =SiR²—, —SiR²R²—, —CR²R²—CR²R²—, and —CR²=CR²—; and
R², at each occurrence, independently can be H or Rᵉ, wherein Rᵉ is as defined in claim 1.

7. A copolymer according to claim 2, wherein Ar, at each occurrence, is independently selected from:

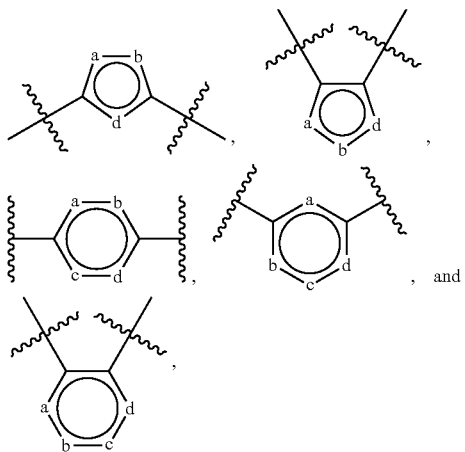

wherein:
a, b, c and d independently are selected from —S—, —O—, —CH=, =CH—, —CR³=, =CR³—, —C(O)—, —C(C(CN)₂)—, —N=, =N—, —NH— and —NR³—;
R³, at each occurrence, is independently selected from a) halogen, b) —CN, c) —NO₂, d) —N(Rᶜ)₂, e) —ORᶜ, f) —C(O)Rᶜ, g) —C(O)ORᶜ, h) —C(O)N(Rᶜ)₂, i) a C₁₋₄₀ alkyl group, j) a C₂₋₄₀ alkenyl group, k) a C₂₋₄₀ alkynyl group, l) a C₁₋₄₀ alkoxy group, m) a C₁₋₄₀ alkylthio group, n) a C₁₋₄₀ haloalkyl group, o) a —Y—C₃₋₁₄ cycloalkyl group, p) a —Y—C₆₋₁₄ aryl group, q) a —Y-3-14 membered cycloheteroalkyl group, and r) a —Y-5-14 membered heteroaryl group, wherein each of the C₁₋₄₀ alkyl group, the C₂₋₄₀ alkenyl group, the C₂₋₄₀ alkynyl group, the C₃₋₁₄ cycloalkyl group, the C₆₋₁₄ aryl group, the 3-14 membered cycloheteroalkyl group, and the 5-14 membered heteroaryl group optionally is substituted with 1-5 Rᵉ groups;
wherein Rᶜ, Rᵉ and Y are as defined in claim 1.

8. A copolymer according to claim 1, wherein (Ar)ₘ, (Ar)ₘ', and (Ar)ₘ'' are selected from:

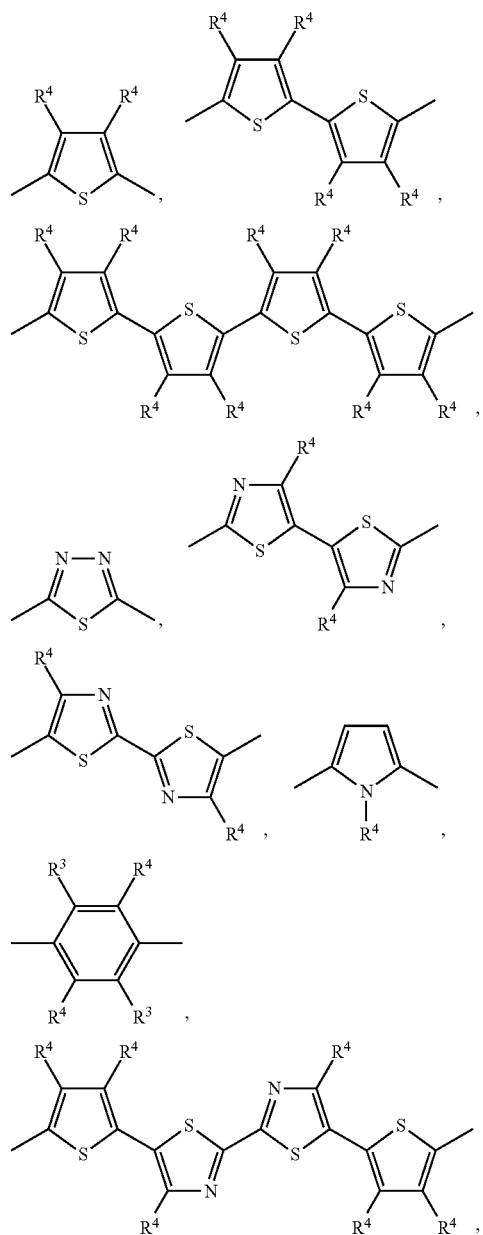

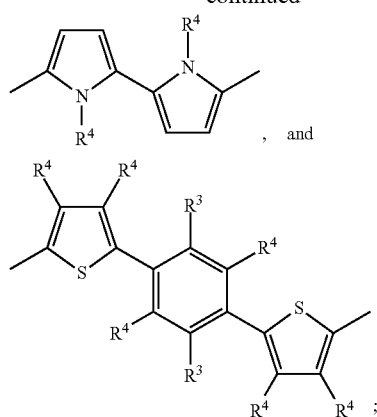
wherein R⁴, at each occurrence, independently is H or R³, and R³ is as defined in claim 7.
9. A copolymer according to claim 2, wherein π-2 is selected from:
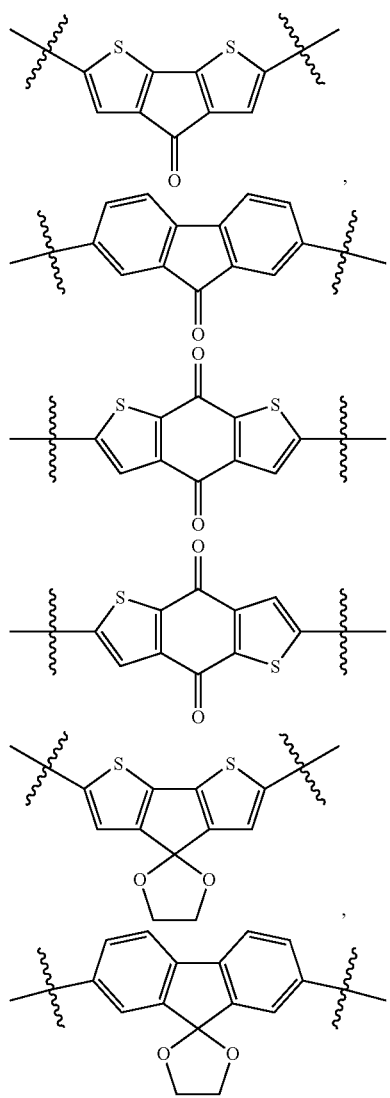
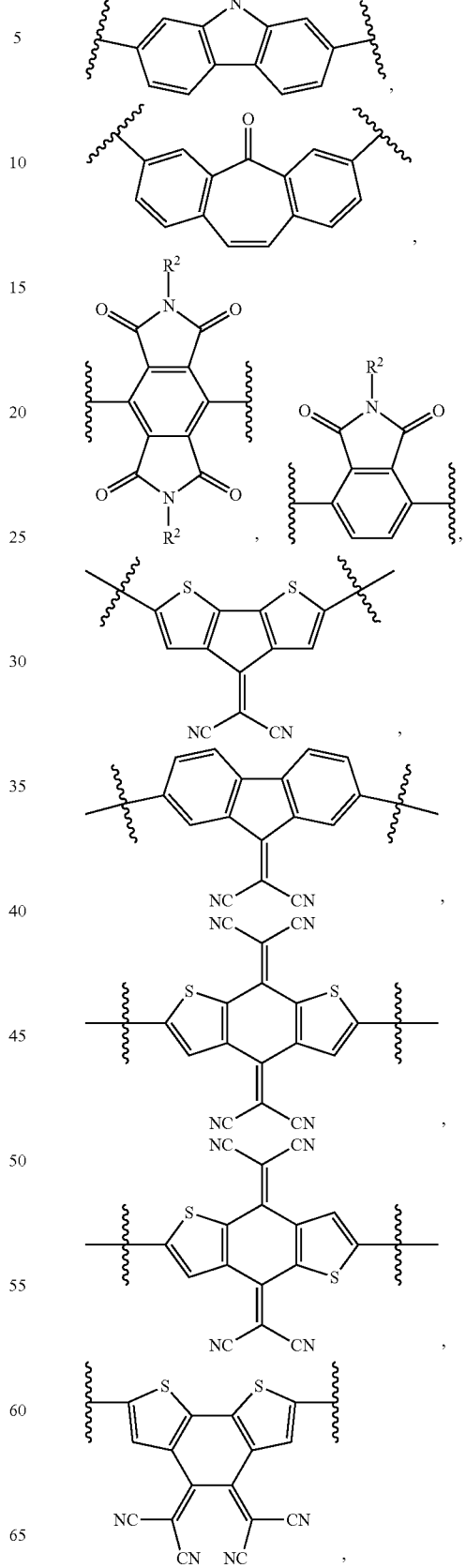

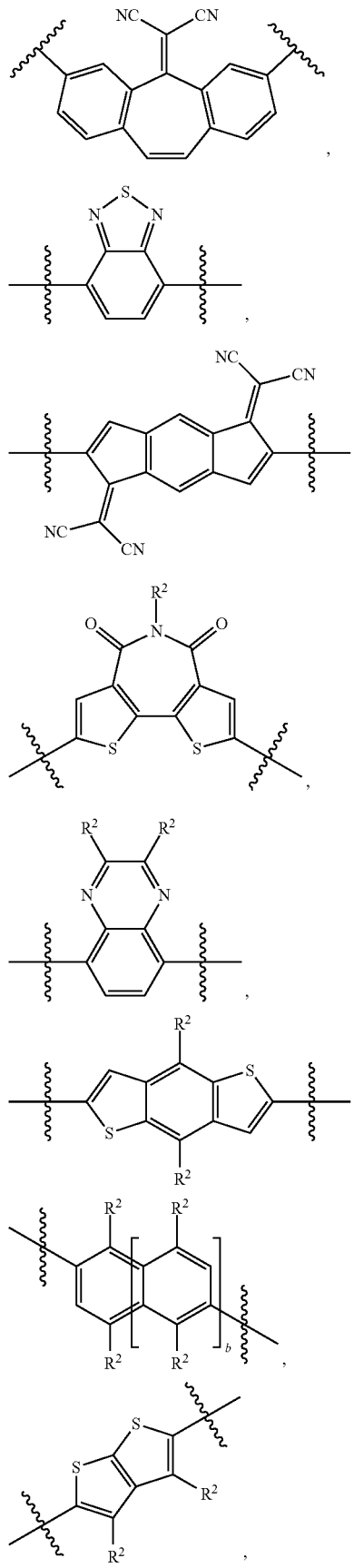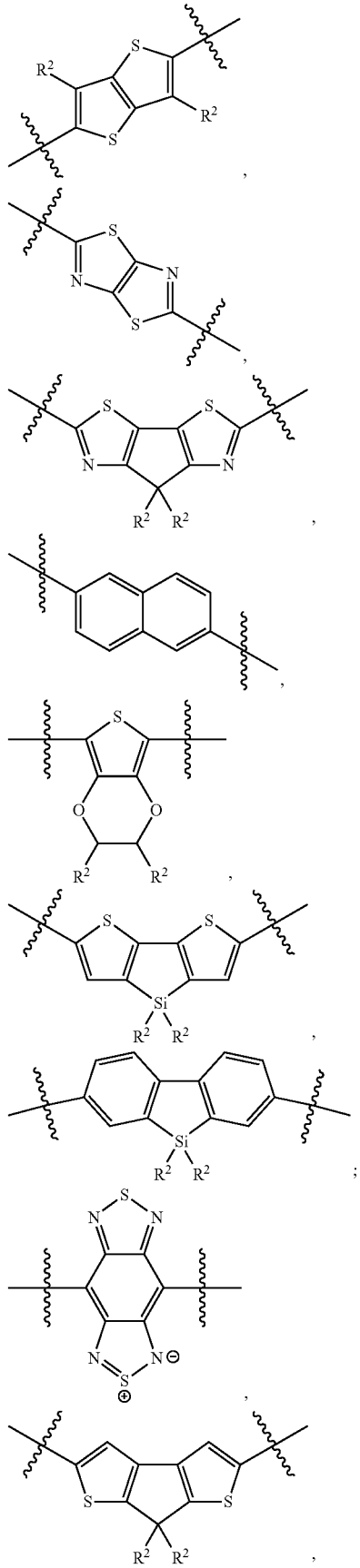

71
-continued
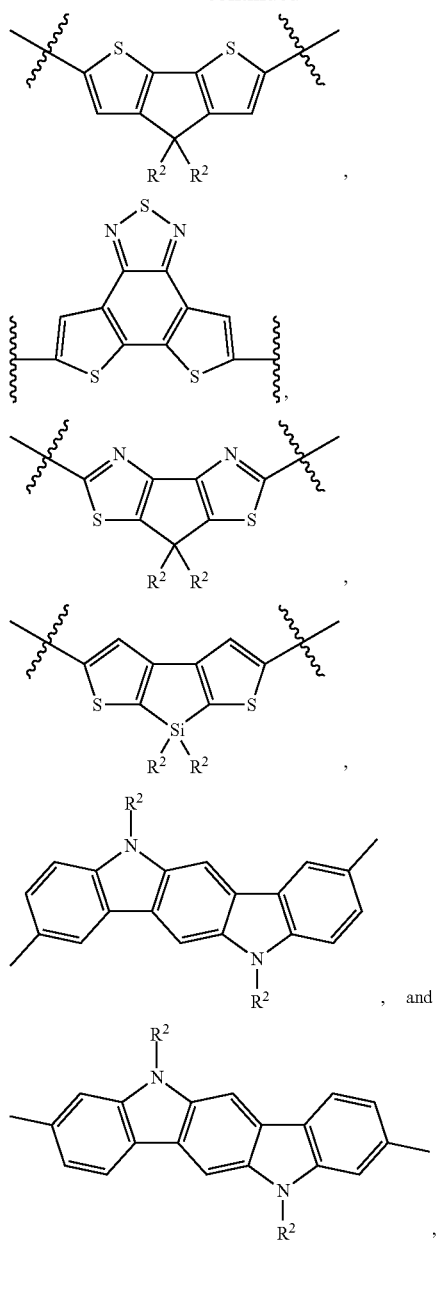
wherein R² is selected from a C₁₋₂₀ alkyl group, a C₁₋₂₀ alkoxy group, and a C₁₋₂₀ haloalkyl group.
10. A copolymer according to claim 2, wherein M₂ is selected from:
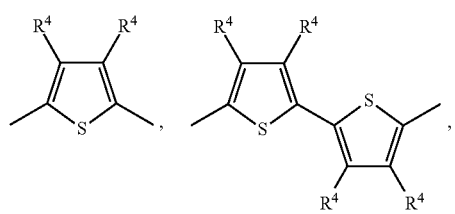
72
-continued
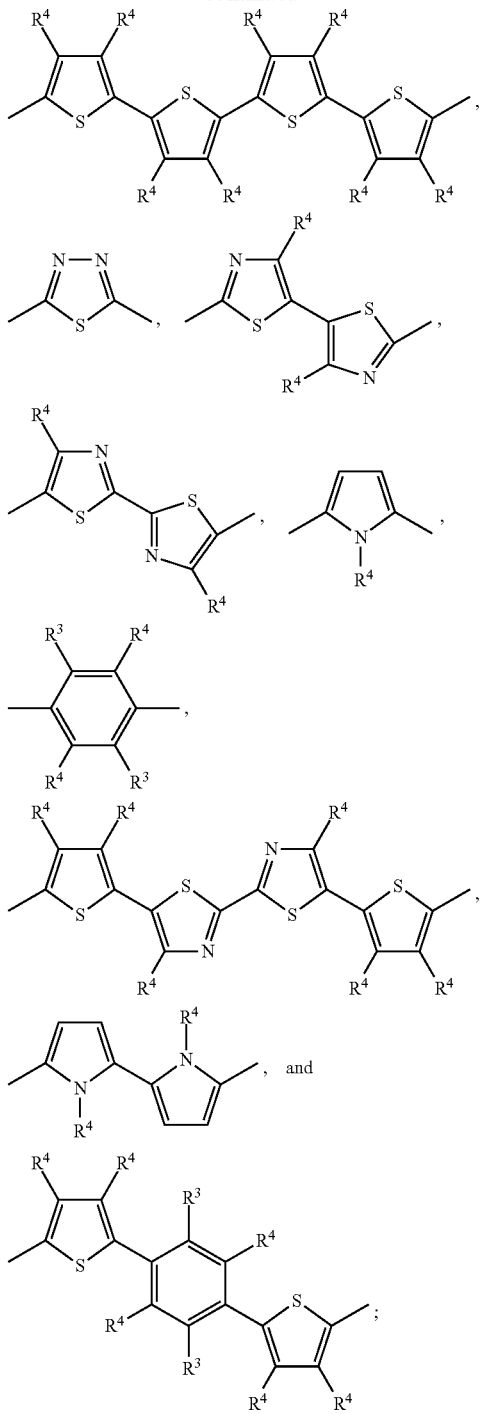
wherein R³ and R⁴ are as defined in claim 8.
11. A copolymer according to claim 2, wherein M₂ is selected from:
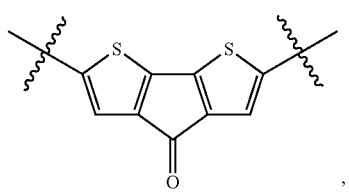

73
-continued
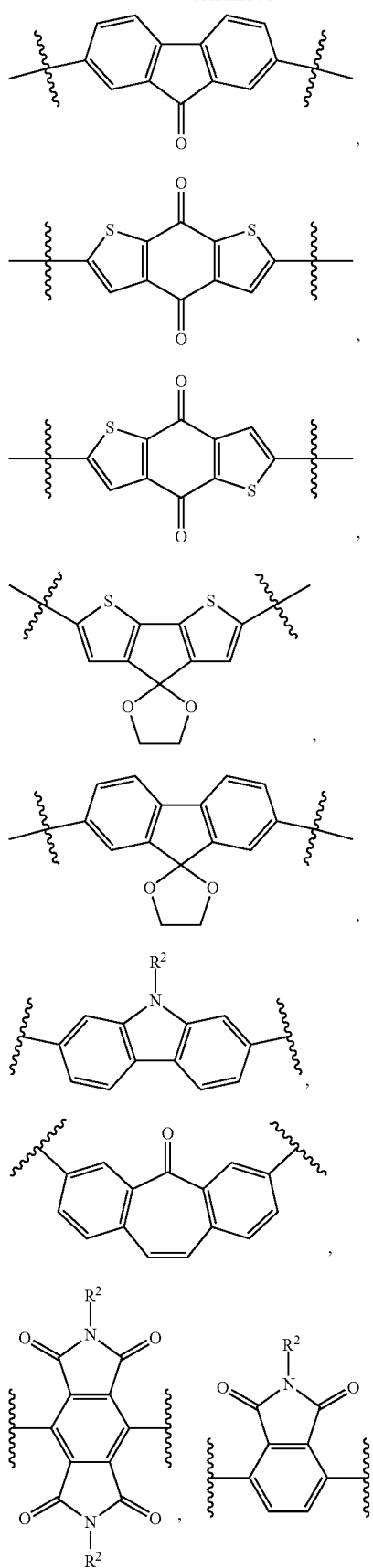
74
-continued
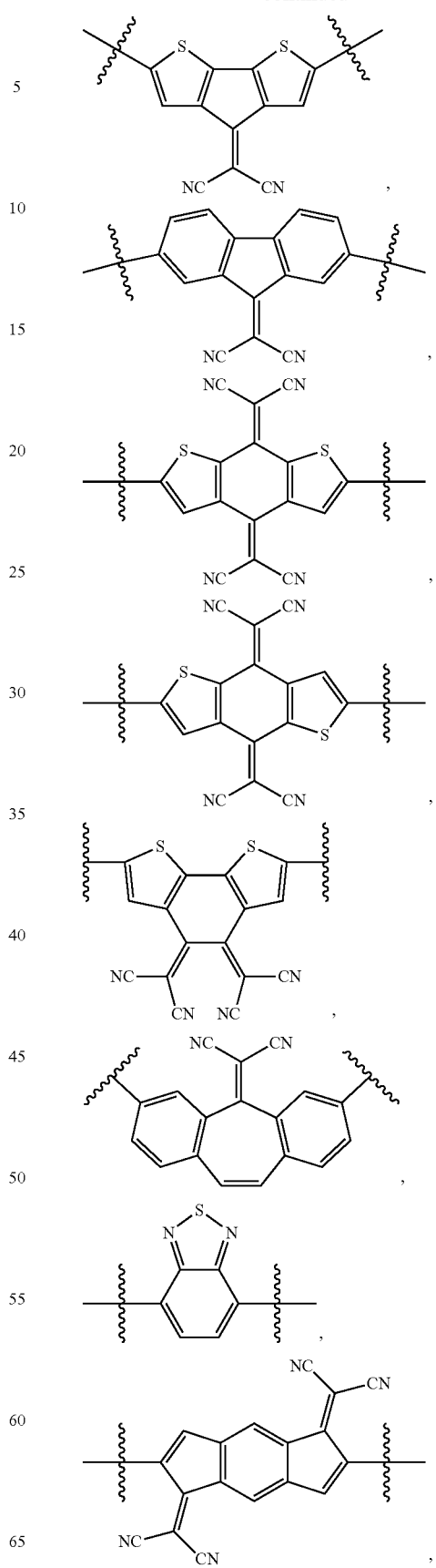

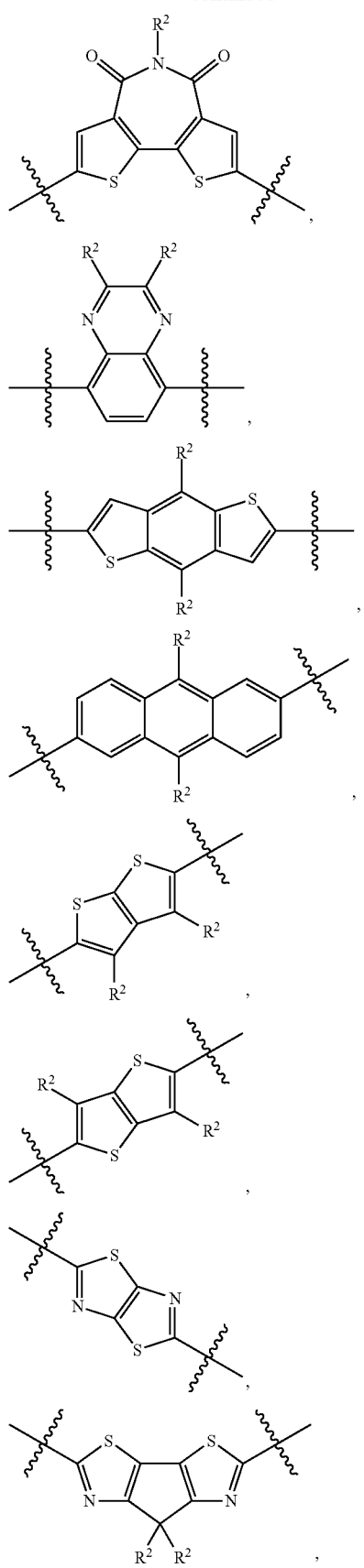
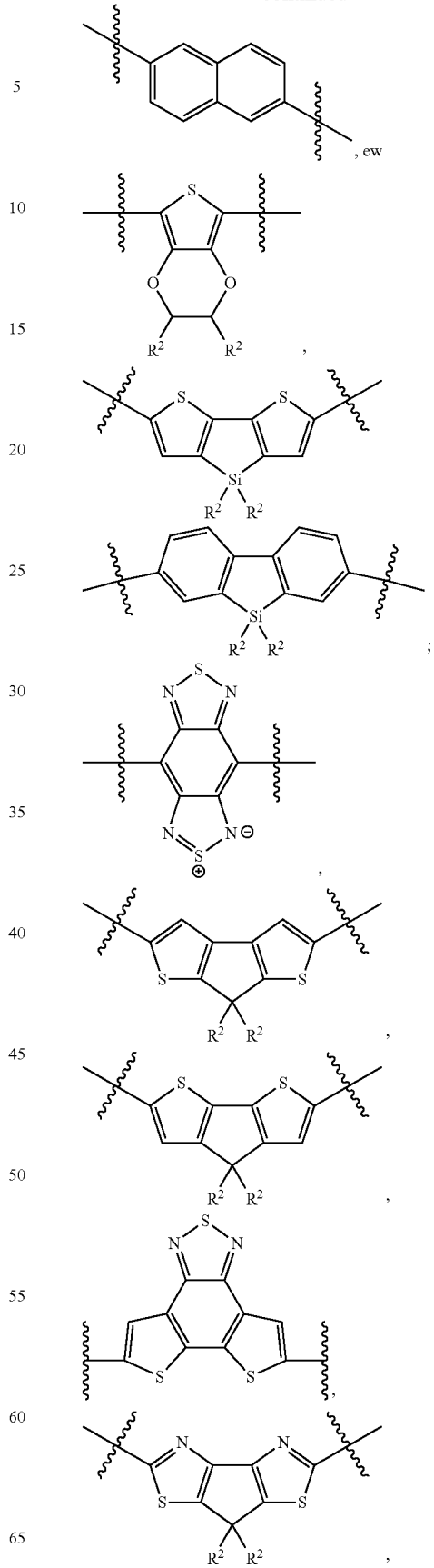

-continued

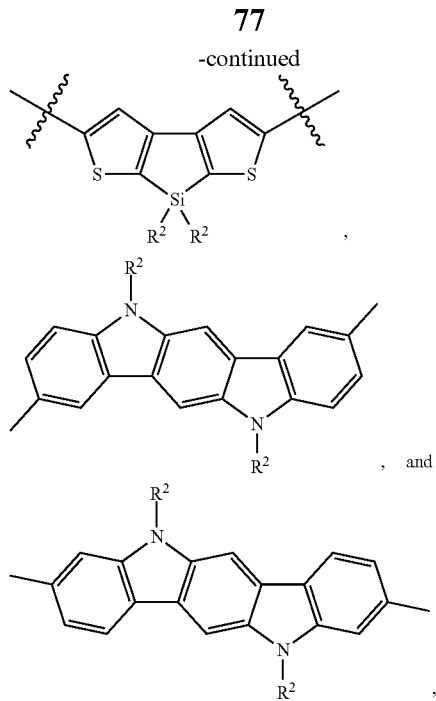

wherein R² is selected from a C₁₋₂₀ alkyl group, a C₁₋₂₀ alkoxy group, and a C₁₋₂₀ haloalkyl group.

12. A copolymer according to claim 2, wherein M₂ is selected from:

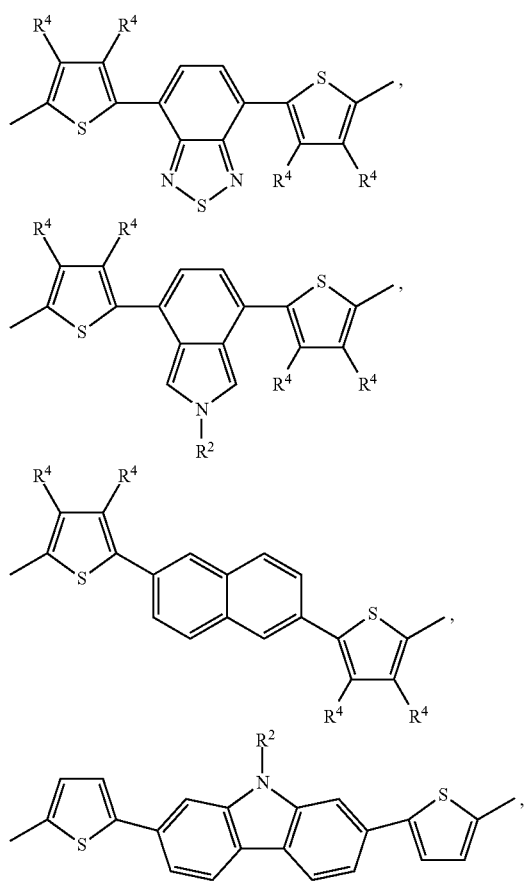

-continued

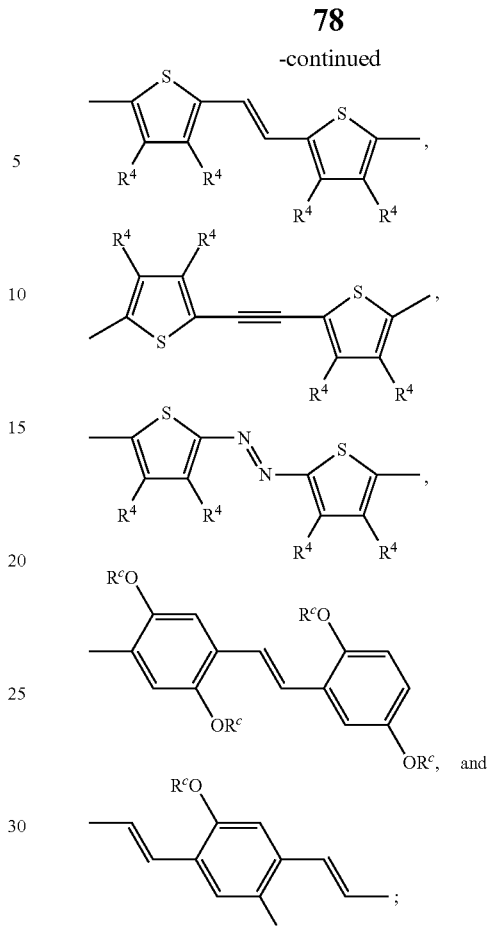

wherein R² is selected from a C₁₋₂₀ alkyl group, a C₁₋₂₀ alkoxy group, and a C₁₋₂₀ haloalkyl group; R^c is a C₁₋₆ alkyl group; and R³ and R⁴ are as defined in claim 8.

13. A homopolymer or copolymer according to claim 1, wherein R¹, at each occurrence, is independently selected from:

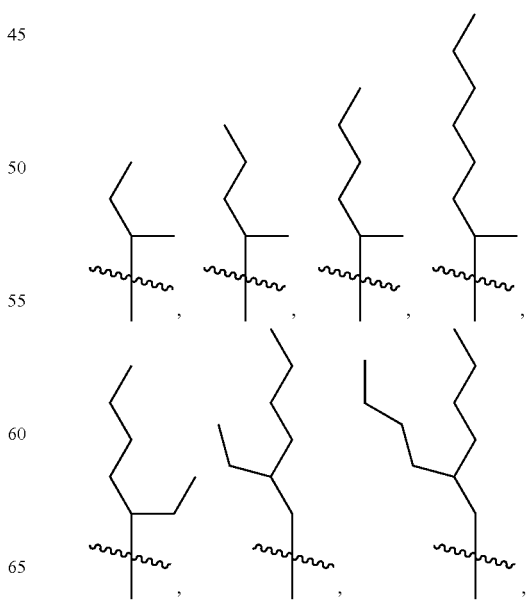

79
-continued
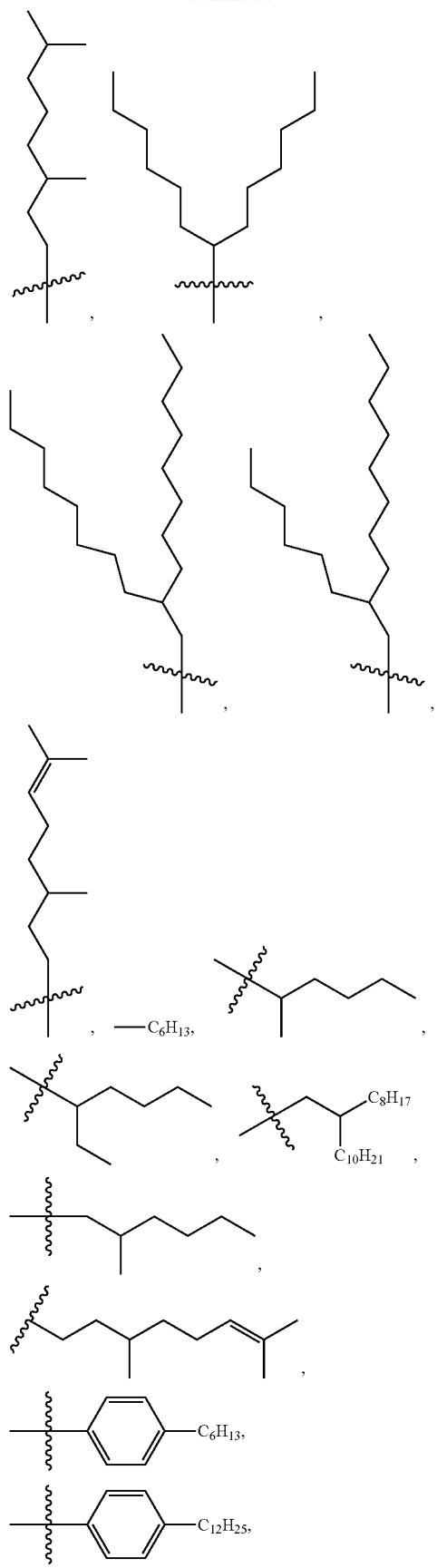
80
-continued
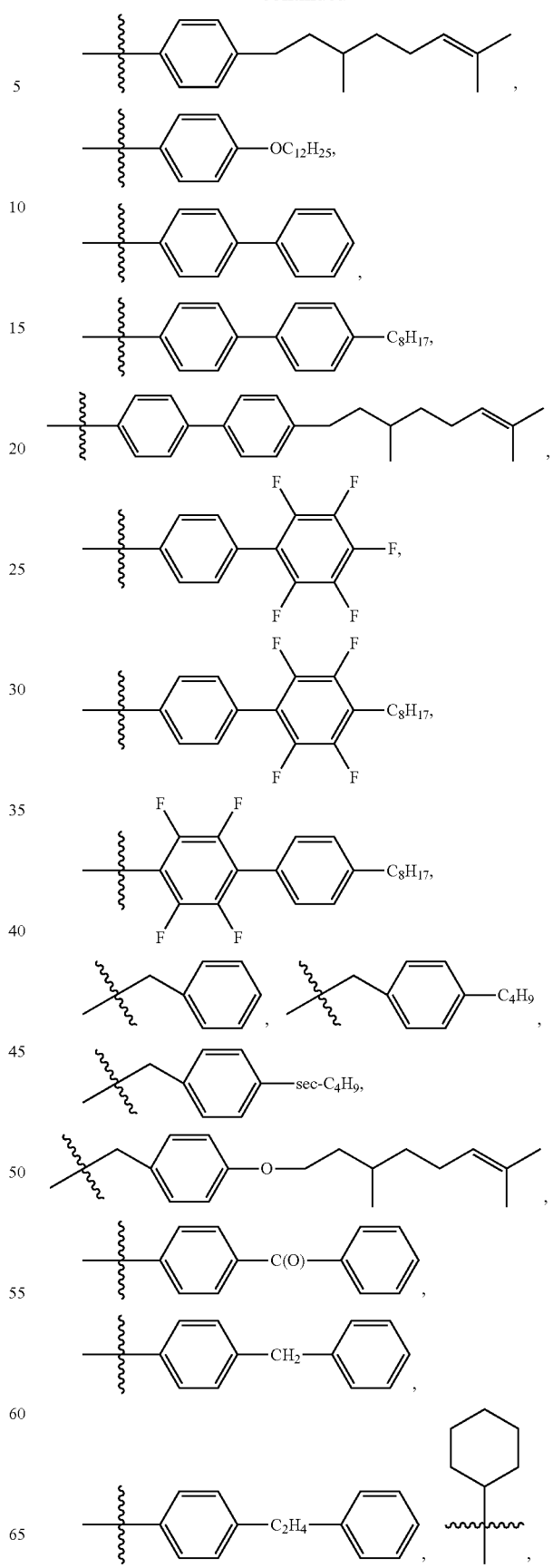

-continued

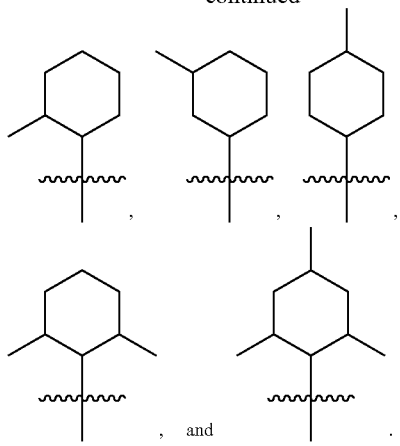

14. A homopolymer or copolymer according to claim 1, wherein $R^1$ is independently selected from a branched $C_{3-40}$ alkyl group or a branched $C_{3-40}$ alkenyl group.

15. A homopolymer or copolymer according to claim 1, wherein $R^1$ is independently selected from an n-hexyl group, a 1-methylhexyl group, a 2-ethylhexyl group, and a 2-octyldodecyl group.

16. A homopolymer or copolymer according to claim 1, wherein $R^1$ is a -L-$C_{3-14}$ cycloalkyl group optionally substituted with 1-4 $C_{1-6}$ alkyl groups, wherein L is as defined in claim 1.

17. A homopolymer or copolymer according to claim 1, wherein n is an integer between 4 and 1,000.

18. An article of manufacture comprising a thin film semiconductor comprising one or more homopolymers or copolymers of claim 1.

19. The article of manufacture of claim 18, wherein the article of manufacture is an electronic device, an optical device, or an optoelectronic device.

20. The article of manufacture of claim 18, wherein the article of manufacture is selected from an organic field effect transistor device, an organic photovoltaic device, and an organic light emitting device.

* * * * *